United States Patent
Sugiyama

[11] Patent Number: 5,991,487
[45] Date of Patent: Nov. 23, 1999

[54] SILICON-BASED SEMICONDUCTOR PHOTODETECTOR WITH AN IMPROVED THIN OPTICAL WAVEGUIDE LAYER

[75] Inventor: Mitsuhiro Sugiyama, Tokyo, Japan

[73] Assignee: NEC Corporation, Tokyo, Japan

[21] Appl. No.: 08/934,891

[22] Filed: Sep. 22, 1997

[30] Foreign Application Priority Data

Sep. 20, 1996 [JP] Japan .................................. 8-249956

[51] Int. Cl.$^6$ ...................................................... G02B 6/10
[52] U.S. Cl. .......................... 385/129; 385/130; 757/186; 757/431
[58] Field of Search ................................ 385/130, 129; 257/431, 432, 186

[56] References Cited

U.S. PATENT DOCUMENTS

| | | | |
|---|---|---|---|
| 4,906,583 | 3/1990 | Kagawa et al. | 437/5 |
| 5,001,335 | 3/1991 | Takaoka et al. | 250/211 J |
| 5,128,743 | 7/1992 | Tamaki et al. | 357/50 |
| 5,332,919 | 7/1994 | Fujimura | 257/434 |
| 5,559,912 | 9/1996 | Agahi et al. | 385/42 |
| 5,583,058 | 12/1996 | Utsumi et al. | 437/3 |
| 5,646,432 | 7/1997 | Iwaki et al. | 257/347 |
| 5,747,860 | 5/1998 | Sugiyama et al. | 257/432 |

OTHER PUBLICATIONS

B. Jalali, et al., "Si–Based Receivers for Optical Data Links", pp. 930–934, Journal of Lightwave Technology, vol. 12 No. 6, Jun. 1994.

M. Sugiyama, et al., "A selective epitaxial SiGe/Si planar photodetector for Si–based OEICs", pp. 22.7.1—22.7.4, IEEE, 1995.

*Primary Examiner*—Rodney Bovernick
*Assistant Examiner*—Victoria D. Hao
*Attorney, Agent, or Firm*—Young & Thompson

[57] ABSTRACT

An optical waveguide layer in a semiconductor photodetector includes a first interface in contact directly with a first insulation layer and a second interface in contact directly with a second insulation layer, wherein each of the first and second insulation layers is much lower in refractive index than any parts of the optical waveguide layer so that a light being propagated through the optical waveguide layer reflects at the first and second interfaces without any permeation into the first and second insulation layers.

81 Claims, 6 Drawing Sheets

SILICON-BASED SEMICONDUCTOR PHOTODETECTOR WITH AN IMPROVED THIN OPTICAL WAVEGUIDE LAYER

BACKGROUND OF THE INVENTION

The present invention relates to a semiconductor photodetector, and more particularly to a silicon-based semiconductor photodetector having a thickness-reduced optical waveguide layer including an optical absorption layer.

A conventional mesa-structure Si-based semiconductor photodetector will be described with reference to FIG. 1. A first Si cladding layer 11 is formed on an n-type silicon layer 3. The first Si cladding layer 11 has a recessed portion surrounding a mesa-portion. An optical absorption layer 4 is formed on the mesa-portion of the first Si cladding layer 11. A second Si cladding layer 11 is formed on the optical absorption layer 4. A silicon oxide film 7 is formed on the recessed portion of the first Si cladding layer 11 and the vertical side walls of the mesa-structure as well as a peripheral region of the top surface of the mesa structure. An aluminum electrode 9 is provided on the top surface of the mesa structure except for the peripheral region of the top surface of the mesa structure. This mesa-type Si-based semiconductor photodetector is disclosed in Journal of Light Wave Technology Vol. 12, No. 6, 1994, pp. 930–935.

A difference in refractive index between the n-type and p-type silicon layers 11 acting as the cladding layer and the Si/SiGe optical absorption layer 4 acting as a core layer is small. Silicon has a refractive index of about 3.5, whilst SiGe has a refractive index of about 3.6. Such the small difference in refractive index between the core layer 4 and the cladding layers 11 allows a remarkable permeation of the light into the cladding layers 11 in accordance with Goose-Henshen Shift Phenomenon. The depth of the permeation of the light into the cladding layers 11 is about 1 micrometer. In order to prevent the optical loss, each of the cladding layers 11 must have a thickness thicker than the depth of permeation of the light into the cladding layers 11, for example, more than 1 micrometer. This means that the optical waveguide layer comprising the cladding layers 11 and the optical absorption layer 4 must have a large thickness. This means that the mesa-structure has a large height or a large step.

A conventional planer Si-based semiconductor photodetector will be described with reference to FIG. 2. A silicon oxide film 2 is formed on an insulation substrate 1a. An n-type silicon layer 3 is formed on the silicon oxide film 2. A trench groove 10 is formed in the n-type silicon layer 3. Silicon oxide films 6 are formed on vertical side walls of the trench groove 10. An optical absorption layer 4 is selectively and epitaxially grown on the bottom surface of the trench groove 10 so that the optical absorption layer 4 is buried in the trench groove 10 except for an upper region of the trench groove 10. A p-type silicon layer 5 is subsequently and epitaxially grown on the optical absorption layer 4 so that a top surface of the p-type silicon layer 5 has the same level as the top surface of the n-type silicon layer 3. A silicon oxide film 7 is formed over the top surface of the n-type silicon layer 3 and a peripheral region of the p-type silicon layer 5. An aluminum electrode 9 is provided which extends over the p-type silicon layer 5 except for the peripheral region thereof. This planer-type Si-based semiconductor photodetector is disclosed in the Japanese laid-open patent publications Nos. 7-231113 and 7-52700 as well as in IEDM Technical Digest 1995, pp. 583–586.

A difference in refractive index between the n-type and p-type silicon layers 3 and 5 acting as the cladding layer and the Si/SiGe optical absorption layer 4 acting as a core layer is small. Silicon has a refractive index of about 3.5, whilst SiGe has a refractive index of about 3.6. Such the small difference in refractive index between the core layer 4 and the cladding layers 3 and 5 allows a remarkable permeation of the light into the cladding layers 3 and 5 in accordance with Goose-Henshen Shift Phenomenon. The depth of the permeation of the light into the cladding layers 3 and 5 is about 1 micrometer. In order to prevent the optical loss, each of the cladding layers 3 and 5 must have a thickness thicker than the depth of permeation of the light into the cladding layers 3 and 5, for example, more than 1 micrometer. This means that the optical waveguide layer comprising the cladding layers 3 and 5 and the optical absorption layer 4 must have a large thickness. This means that it is difficult to do an epitaxial growth of the thick silicon layer.

In the above circumstances, it had been required to provide a novel mesa-structure Si-based semiconductor photodetector free from the above problems and also provide a novel planer Si-based semiconductor photodetector free from the above problems.

SUMMARY OF THE INVENTION

Accordingly, it is an object of the present invention to provide a novel planer Si-based semiconductor photodetector free from the above problems and disadvantages as described above.

It is a further object of the present invention to provide a novel planer Si-based semiconductor photodetector having a thinner optical waveguide layer.

It is a still further object of the present invention to provide a novel planer Si-based semiconductor photodetector having thinner cladding layers sandwiching an optical absorption layer.

It is yet a further object of the present invention to provide a novel planer Si-based semiconductor photodetector having a higher absorption coefficient.

It is another object of the present invention to provide a novel mesa-structure Si-based semiconductor photodetector free from the above problems and disadvantages as described above.

It is still another object of the present invention to provide a novel mesa-structure Si-based semiconductor photodetector having a thinner optical waveguide layer.

It is yet another object of the present invention to provide a novel mesa-structure Si-based semiconductor photodetector having thinner cladding layers sandwiching an optical absorption layer.

It is further more object of the present invention to provide a novel mesa-structure Si-based semiconductor photodetector having a higher absorption coefficient.

The above and other objects, features and advantages of the present invention will be apparent from the following descriptions.

The present invention provides an optical waveguide layer in a semiconductor photodetector. The optical waveguide layer has a first interface in contact directly with a first insulation layer and a second interface in contact directly with a second insulation layer, wherein each of the first and second insulation layers is much lower in refractive index than any parts of the optical waveguide layer so that a light be propagated through the optical waveguide layer with reflection at the first and second interfaces and without any permeation into the first and second insulation layers.

BRIEF DESCRIPTIONS OF THE DRAWINGS

Preferred embodiments according to the present invention will be described in detail with reference to the accompanying drawings.

DISCLOSURE OF THE INVENTION

The first present invention provides an optical waveguide layer in a semiconductor photodetector. The optical waveguide layer has a first interface in contact directly with a first insulation layer and a second interface in contact directly with a second insulation layer, wherein each of the first and second insulation layers is much lower in refractive index than any parts of the optical waveguide layer so that a light be propagated through the optical waveguide layer with reflection at the first and second interfaces and without any permeation into the first and second insulation layers.

Since each of the first and second insulation layers has a refractive index much lower than any parts of the optical waveguide layer, then the first and second insulation layers can serve as optical reflectors which are capable of reflecting any light without any permeation of the light into the first and second insulation layers so as to confine the light within the optical waveguide layer. Since the optical waveguide layer includes an optical absorption layer which is capable of absorbing the light or photons in place to generate electron-hole pairs which act as carriers in the photodetector.

Figure 5:
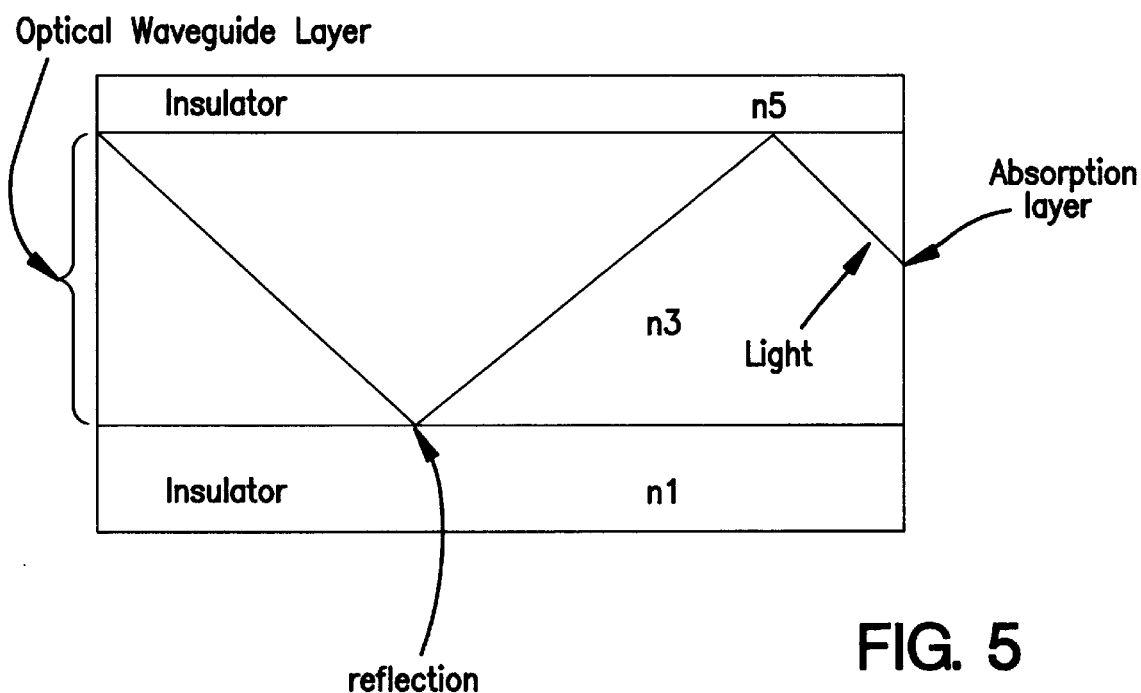
FIG. 5 is a fragmentary cross sectional elevation view illustrative of still another novel sandwiching structure of an optical waveguide layer sandwiched by first and second insulation layers in accordance with the present invention.

As illustrated in FIG. 5, the optical waveguide layer may comprise an optical absorption layer sandwiched by the first and second insulation layers. In this case, all parts of the light propagating through the optical waveguide are confined in the optical absorption layer with reflections by the first and second insulation layers without, however, any permeation of the light into the first and second insulation layers. This structure provides a high absorption coefficient to the optical absorption layer. In order to further increase the absorption coefficient of the optical absorption layer, the optical absorption layer may comprise an Si/SiGe multiple quantum well absorption layer.

Figure 1:
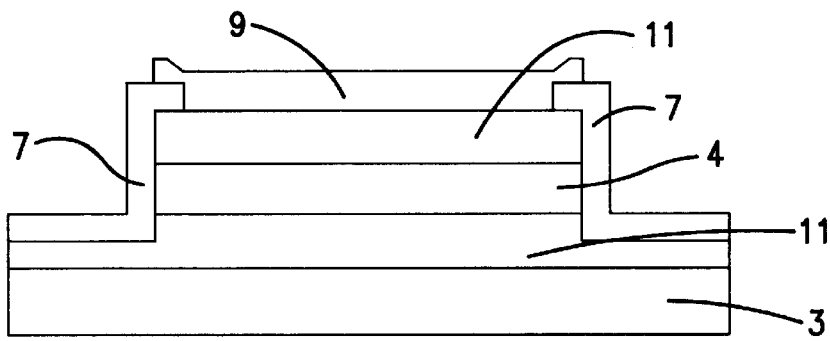
FIG. 1 is a fragmentary cross sectional elevation view illustrative of the conventional mesa-structure Si-based semiconductor photodetector
Figure 2:
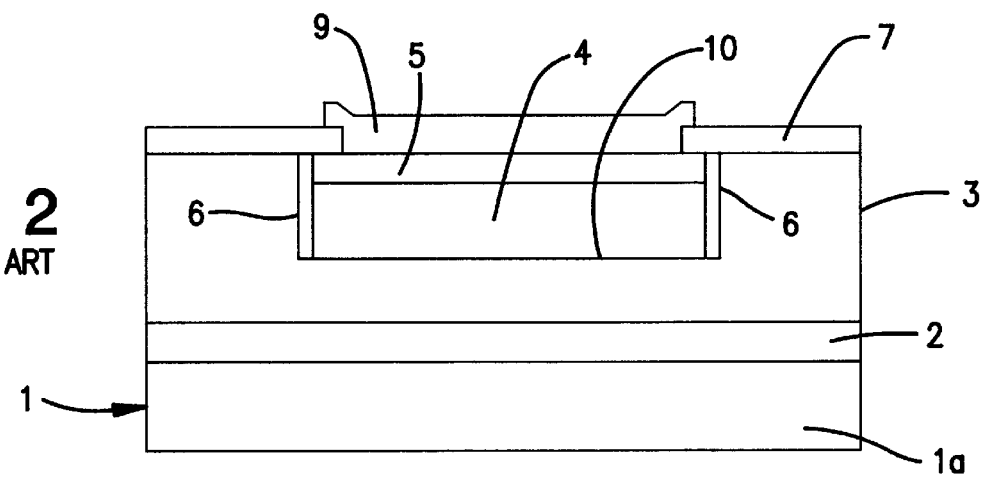
FIG. 2 is a fragmentary cross sectional elevation view illustrative of the conventional planer Si-based semiconductor photodetector.
Figure 3:
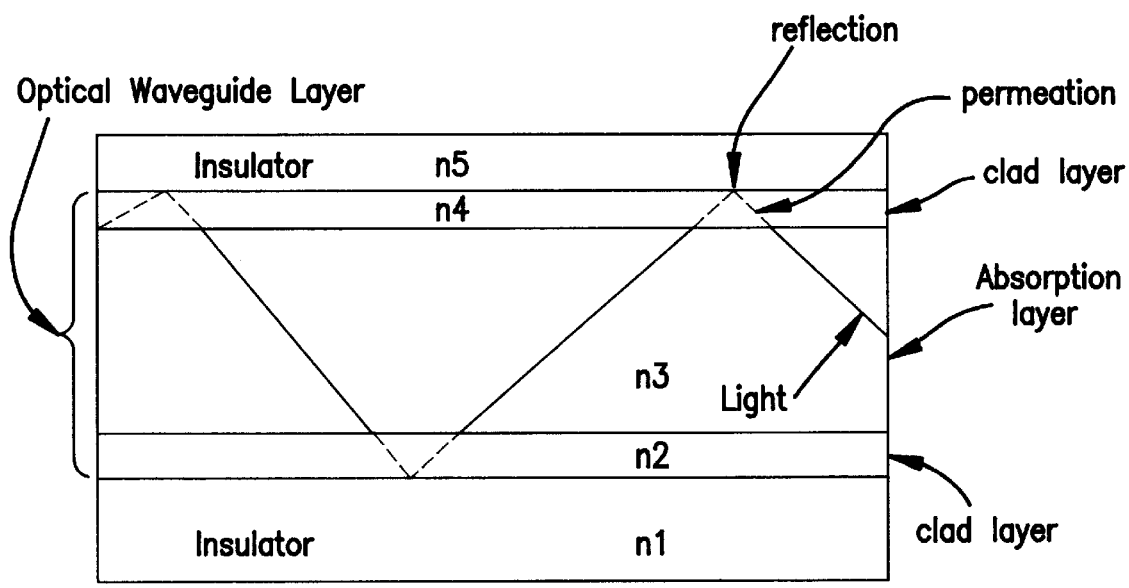
FIG. 3 is a fragmentary cross sectional elevation view illustrative of a novel sandwiching structure of an optical waveguide layer sandwiched by first and second insulation layers in accordance with the present invention.

Alternatively, as illustrated in FIG. 3, the optical waveguide layer may comprise an optical absorption layer sandwiched by both a first cladding layer in contact directly with the first insulation layer and a second cladding layer in contact directly with the second insulation layer. In this case, majority parts of the light propagating through the optical waveguide are confined in the optical absorption layer with slight permeation of the light into the first and second cladding layers. The first and second insulation layers allow a remarkable reduction in thickness of the first and second cladding layers because the first and second insulation layers are capable of reflecting the light having been permeating into the first and second cladding layers. Namely, even the thicknesses of the first and second cladding layers are much thinner than a critical thickness corresponding to a depth of permeation of the light into the first and second cladding layers, the first and second insulation layers are capable of reflecting the light having been permeating into the first and second cladding layers so that the majority parts of the light propagating through the optical waveguide layer are confined within the optical absorption layer. This structure provides a high absorption coefficient to the optical absorption layer. If, for example, the depth of permeation of the light into the first and second cladding layers is 1.0 micrometer, then the thickness of each of the first and second cladding layers has a thickness of less than 1.0 micrometer. Preferably, each of the first and second insulation layers has a thickness of less than 0.5 micrometers. More preferably, each of the first and second insulation layers has a thickness of less than 0.2 micrometers.

It is available that the optical absorption layer comprises an Si/SiGe multiple quantum well absorption layer and the first and second cladding layers comprise impurity doped Si epitaxial layers. In order to further increase the absorption coefficient of the absorption layer, it is effective that the first and second cladding layers have substantially the same thickness and substantially the same refractive index, and further the first and second insulation layers also have substantially the same thickness and substantially the same refractive index so as to obtain a symmetrical refractive index profile in a direction perpendicular to the interfaces of the optical waveguide layer to the first and second insulation layers.

Figure 4:
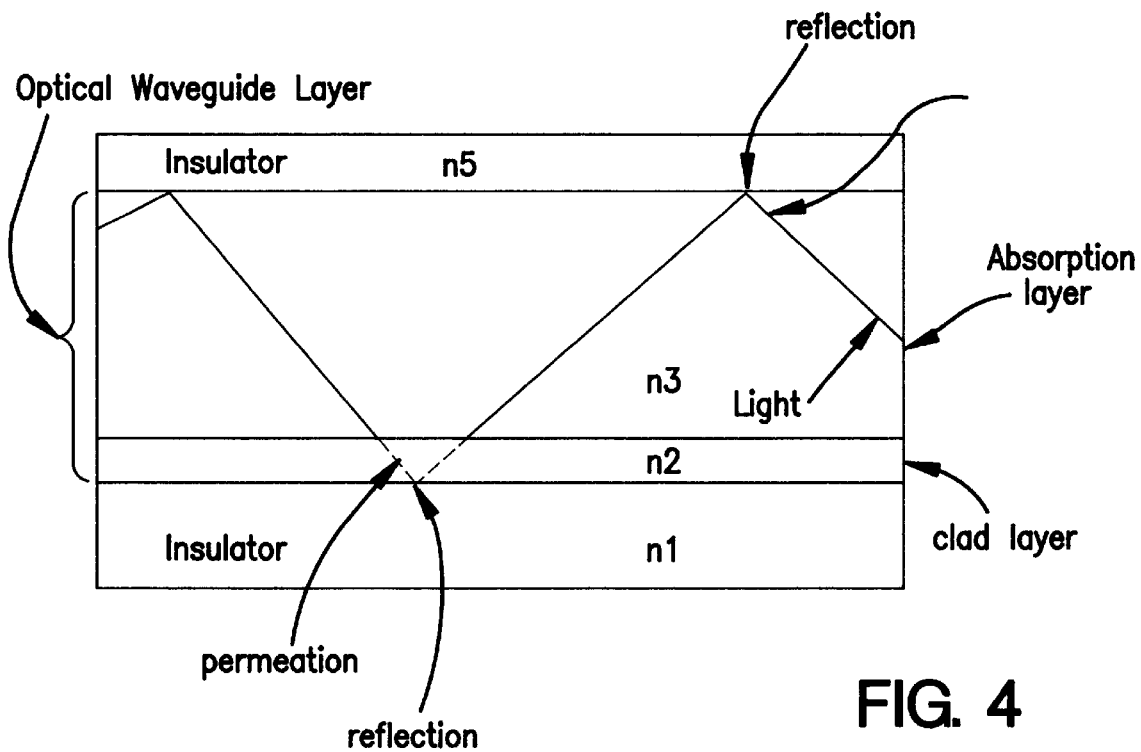
FIG. 4 is a fragmentary cross sectional elevation view illustrative of another novel sandwiching structure of an optical waveguide layer sandwiched by first and second insulation layers in accordance with the present invention.

Further alternatively, as illustrated in FIG. 4, the optical waveguide layer may comprise laminations of both a cladding layer in contact directly with the first insulation layer and an optical absorption layer in contact directly with the second insulation layer. In this case, majority parts of the light propagating through the optical waveguide are confined in the optical absorption layer with slight permeation of the light into the cladding layer. The first insulation layer allows a remarkable reduction in thickness of the cladding layer because the first insulation layer is capable of reflecting the light having been permeating into the cladding layer. Namely, even the thickness of the cladding layer is much thinner than a critical thickness corresponding to a depth of permeation of the light into the cladding layer, the first insulation layer is capable of reflecting the light having been permeating into the first cladding layer. Since the second insulation layer in contact directly with the optical absorption layer is also capable of reflecting the light at the interface of the optical absorption layer to the second insulation layer without permeation of the light into the second insulation layer As a result, the majority parts of the light propagating through the optical waveguide layer are confined within the optical absorption layer. This structure provides a high absorption coefficient to the optical absorption layer. If, for example, the depth of permeation of the light into the first and second cladding layers is 1.0 micrometer, then the thickness of the cladding layer has a thickness of less than 1.0 micrometer. Preferably, the insulation layer has a thickness of less than 0.5 micrometers. More preferably, the insulation layer has a thickness of less than 0.2 micrometers. It is available that the optical absorption layer comprises an Si/SiGe multiple quantum well absorption layer and the first and second cladding layers comprise impurity doped Si epitaxial layers.

Further, the first and second insulation layers may preferably comprise a silicon oxide layer or a silicon nitride layer, although the first and second insulation layers may be made of other insulation materials having a refractive index much lower than any parts of the optical waveguide layer.

The second present invention provides an Si-based thin optical waveguide layer in an Si-based semiconductor photodetector. The Si-based thin optical waveguide layer has a first interface in contact directly with a first Si-based insulation layer and a second interface in contact directly with a second Si-based insulation layer, wherein each of the first and second Si-based insulation layers is lower in refractive index than any parts of the Si-based thin optical waveguide layer so that a light be propagated through the Si-based thin optical waveguide layer with reflection at the first and second interfaces and without any permeation into the first and second Si-based insulation layers.

Since each of the first and second Si-based insulation layers has a refractive index much lower than any parts of the Si-based thin optical waveguide layer, then the first and second Si-based insulation layers can serve as optical reflectors which are capable of reflecting any light without any permeation of the light into the first and second Si-based insulation layers so as to confine the light within the Si-based thin optical waveguide layer. Since the Si-based thin optical waveguide layer includes an Si/SiGe-based optical absorption layer which is capable of absorbing the light or photons in place to generate electron-hole pairs which act as carriers in the photodetector.

As illustrated in FIG. 5, the Si-based thin optical waveguide layer may comprise an Si/SiGe-based optical absorption layer sandwiched by the first and second Si-based insulation layers. In this case, all parts of the light propagating through the optical waveguide are confined in the Si/SiGe-based optical absorption layer with reflections by the first and second Si-based based insulation layers without, however, any permeation of the light into the first and second Si-based insulation layers. This structure provides a high absorption coefficient to the Si/SiGe-based optical absorption layer. In order to further increase the absorption coefficient of the Si/SiGe-based optical absorption layer, the Si/SiGe-based optical absorption layer may comprise an Si/SiGe multiple quantum well absorption layer.

Alternatively, as illustrated in FIG. 3, the Si-based thin optical waveguide layer may comprise an Si/SiGe-based optical absorption layer sandwiched by both a first impurity doped Si cladding layer in contact directly with the first Si-based insulation layer and a second impurity doped Si cladding layer in contact directly with the second Si-based insulation layer. In this case, majority parts of the light propagating through the optical waveguide are confined in the Si/SiGe-based optical absorption layer with slight permeation of the light into the first and second impurity doped Si cladding layers. The first and second Si-based insulation layers allow a remarkable reduction in thickness of the first and second impurity doped Si cladding layers because the first and second Si-based insulation layers are capable of reflecting the light having been permeating into the first and second impurity doped Si cladding layers. Namely, even the thicknesses of the first and second impurity doped Si cladding layers are much thinner than a critical thickness corresponding to a depth of permeation of the light into the first and second impurity doped Si cladding layers, the first and second Si-based insulation layers are capable of reflecting the light having been permeating into the first and second impurity doped Si cladding layers so that the majority parts of the light propagating through the Si-based thin optical waveguide layer are confined within the Si/SiGe-based optical absorption layer. This structure provides a high absorption coefficient to the Si/SiGe-based optical absorption layer. If, for example, the depth of permeation of the light into the first and second impurity doped Si cladding layers is 1.0 micrometer, then the thickness of each of the first and second impurity doped Si cladding layers has a thickness of less than 1.0 micrometer. Preferably, each of the first and second insulation layers has a thickness of less than 0.5 micrometers. More preferably, each of the first and second insulation layers has a thickness of less than 0.2 micrometers. It is available that the Si/SiGe-based optical absorption layer comprises an Si/SiGe multiple quantum well absorption layer and the first and second impurity doped Si cladding layers comprise impurity doped Si epitaxial layers. In order to further increase the absorption coefficient of the absorption layer, it is effective that the first and second impurity doped Si cladding layers have substantially the same thickness and substantially the same refractive index, and further the first and second Si-based insulation layers also have substantially the same thickness and substantially the same refractive index so as to obtain a symmetrical refractive index profile in a direction perpendicular to the interfaces of the Si-based thin optical waveguide layer to the first and second Si-based insulation layers.

Further alternatively, as illustrated in FIG. 4, the Si-based thin optical waveguide layer may comprise laminations of both an impurity doped Si cladding layer in contact directly with the first Si-based insulation layer and an Si/SiGe-based optical absorption layer in contact directly with the second Si-based insulation layer. In this case, majority parts of the light propagating through the optical waveguide are confined in the Si/SiGe-based optical absorption layer with slight permeation of the light into the impurity doped Si cladding layer. The first Si-based insulation layer allows a remarkable reduction in thickness of the impurity doped Si cladding layer because the first Si-based insulation layer is capable of reflecting the light having been permeating into the impurity doped Si cladding layer. Namely, even the thickness of the impurity doped Si cladding layer is much thinner than a critical thickness corresponding to a depth of permeation of the light into the impurity doped Si cladding layer, the first Si-based insulation layer is capable of reflecting the light having been permeating into the first impurity doped Si cladding layer. Since the second Si-based insulation layer in contact directly with the Si/SiGe-based optical absorption layer is also capable of reflecting the light at the interface of the Si/SiGe-based optical absorption layer to the second Si-based insulation layer without permeation of the light into the second Si-based insulation layer. As a result, the majority parts of the light propagating through the Si-based thin optical waveguide layer are confined within the Si/SiGe-based optical absorption layer. This structure provides a high absorption coefficient to the Si/SiGe-based optical absorption layer. If, for example, the depth of permeation of the light into the first and second impurity doped Si cladding layers is 1.0 micrometer, then the thickness of the impurity doped Si cladding layer has a thickness of less than 1.0 micrometer. Preferably, each of the first and second insulation layers has a thickness of less than 0.5 micrometers. More preferably, each of the first and second insulation layers has a thickness of less than 0.2 micrometers. It is available that the Si/SiGe-based optical absorption layer comprises an Si/SiGe multiple quantum well absorption layer and the first and second impurity doped Si cladding layers comprise impurity doped Si epitaxial layers.

Further, the first and second Si-based insulation layers may preferably comprise a silicon oxide layer or a silicon nitride layer, although the first and second Si-based insulation layers may be made of other insulation materials having a refractive index much lower than any parts of the Si-based thin optical waveguide layer.

The third present invention provides an Si-based thin optical waveguide layer in an Si-based semiconductor photodetector. The Si-based thin optical waveguide layer comprises an Si/SiGe multiple quantum well optical absorption layer sandwiched by both first and second impurity doped Si cladding layers. The first insulation layer has a first thickness of not more than 0.5 micrometers. Further, the first impurity doped Si cladding layer has a first interface in contact directly with a first insulation layer made of one selected from the group consisting of silicon oxide and silicon nitride. The second insulation layer has a second thickness of not more than 0.5 micrometers. Further, the second impurity doped Si cladding layer has a second interface in contact directly with a second insulation layer made of one selected from the group consisting of silicon oxide and silicon nitride. A light is propagated through the Si-based thin optical waveguide layer with reflection at the first and second interfaces and without any permeation into the first and second insulation layers. In this case, majority parts of the light propagating through the optical waveguide are confined in the Si/SiGe multiple quantum well optical absorption layer with slight permeation of the light into the first and second impurity doped Si cladding layers. The first and second Si-based insulation layers allow a remarkable reduction in thickness of the first and second impurity doped Si cladding layers because the first and second Si-based insulation layers are capable of reflecting the light having been permeating into the first and second impurity doped Si cladding layers. Namely, even the thicknesses of the first and second impurity doped Si cladding layers are much thinner than a critical thickness corresponding to a depth of permeation of the light into the first and second impurity doped Si cladding layers, the first and second Si-based insulation layers are capable of reflecting the light having been permeating into the first and second impurity doped Si cladding layers so that the majority parts of the light propagating through the Si-based thin optical waveguide layer are confined within the Si/SiGe multiple quantum well optical absorption layer. This structure provides a high absorption coefficient to the Si/SiGe multiple quantum well optical absorption layer.

The fourth present invention provides an Si-based thin optical waveguide layer in an Si-based semiconductor photodetector. The Si-based thin optical waveguide layer comprises laminations of both an Si/SiGe multiple quantum well optical absorption layer and an impurity doped Si cladding layer. The impurity doped Si cladding layer has a thickness of not more than 1.0 micrometer. Further, the impurity doped Si cladding layer has a first interface in contact directly with a first insulation layer made of one selected from the group consisting of silicon oxide and silicon nitride. The Si/SiGe multiple quantum well optical absorption layer has a second interface in contact directly with a second insulation layer made of one selected from the group consisting of silicon oxide and silicon nitride A light is propagated through the Si-based thin optical waveguide layer with reflection at the first and second interfaces and without any permeation into the first and second insulation layers. In this case, majority parts of the light propagating through the optical waveguide are confined in the Si/SiGe multiple quantum well optical absorption layer with slight permeation of the light into the impurity doped Si cladding layer. The first Si-based insulation layer allows a remarkable reduction in thickness of the impurity doped Si cladding layer because the first Si-based insulation layer is capable of reflecting the light having been permeating into the impurity doped Si cladding layer. Namely, even the thickness of the impurity doped Si cladding layer is much thinner than a critical thickness corresponding to a depth of permeation of the light into the impurity doped Si cladding layer, the first Si-based insulation layer is capable of reflecting the light having been permeating into the first impurity doped Si cladding layer. Since the second Si-based insulation layer in contact directly with the Si/SiGe multiple quantum well optical absorption layer is also capable of reflecting the light at the interface of the Si/SiGe multiple quantum well optical absorption layer to the second Si-based insulation layer without permeation of the light into the second Si-based insulation layer. As a result, the majority parts of the light propagating through the Si-based thin optical waveguide layer are confined within the Si/SiGe multiple quantum well optical absorption layer. This structure provides a high absorption coefficient to the Si/SiGe multiple quantum well optical absorption layer.

The fifth present invention provides a semiconductor photodetector comprising the following elements. A first insulation layer is provided on a substrate. A thin optical waveguide layer is provided on the first insulation layer, so that the thin optical waveguide layer has a first interface in contact directly with the first insulation layer. A second insulation layer is formed on the thin optical waveguide layer so that the thin optical waveguide layer has a second interface in contact directly with the second insulation layer. The second insulation layer has contact holes through which electrodes are in contact with the thin optical waveguide layer. Each of the first and second insulation layers is lower in refractive index than any parts of the thin optical waveguide layer so that a light be propagated through the thin optical waveguide layer with reflection at the first and second interfaces and without any permeation into the first and second insulation layers.

Since each of the first and second insulation layers has a refractive index much lower than any parts of the thin optical waveguide layer, then the first and second insulation layers can serve as optical reflectors which are capable of reflecting any light without any permeation of the light into the first and second insulation layers so as to confine the light within the thin optical waveguide layer. Since the thin optical waveguide layer includes an optical absorption layer which is capable of absorbing the light or photons in place to generate electron-hole pairs which act as carriers in the photodetector.

As illustrated in FIG. 5, the thin optical waveguide layer may comprise an optical absorption layer sandwiched by the first and second insulation layers. In this case, all parts of the light propagating through the thin optical waveguide are confined in the optical absorption layer with reflections by the first and second insulation layers without, however, any permeation of the light into the first and second insulation layers. This structure provides a high absorption coefficient to the optical absorption layer. In order to further increase the absorption coefficient of the optical absorption layer, the optical absorption layer may comprise an Si/SiGe multiple quantum well absorption layer.

Alternatively, as illustrated in FIG. 3, the thin optical waveguide layer may comprise an optical absorption layer sandwiched by both a first cladding layer in contact directly with the first insulation layer and a second cladding layer in contact directly with the second insulation layer. In this case, majority parts of the light propagating through the thin optical waveguide are confined in the optical absorption layer with slight permeation of the light into the first and second cladding layers. The first and second insulation layers allow a remarkable reduction in thickness of the first and second cladding layers because the first and second insulation layers are capable of reflecting the light having been permeating into the first and second cladding layers. Namely, even the thicknesses of the first and second cladding layers are much thinner than a critical thickness corresponding to a depth of permeation of the light into the first and second cladding layers, the first and second insulation layers are capable of reflecting the light having been permeating into the first and second cladding layers so that the majority parts of the light propagating through the thin optical waveguide layer are confined within the optical absorption layer. This structure provides a high absorption coefficient to the optical absorption layer. If, for example, the depth of permeation of the light into the first and second cladding layers is 1.0 micrometer, then the thickness of each of the first and second cladding layers has a thickness of less than 1.0 micrometer. Preferably, each of the first and second insulation layers has a thickness of less than 0.5 micrometers. More preferably, each of the first and second insulation layers has a thickness of less than 0.2 micrometers.

It is available that the optical absorption layer comprises an Si/SiGe multiple quantum well absorption layer and the first and second cladding layers comprise impurity doped Si epitaxial layers. In order to further increase the absorption coefficient of the absorption layer, it is effective that the first and second cladding layers have substantially the same thickness and substantially the same refractive index, and further the first and second insulation layers also have substantially the same thickness and substantially the same refractive index so as to obtain a symmetrical refractive index profile in a direction perpendicular to the interfaces of the thin optical waveguide layer to the first and second insulation layers.

Further alternatively, as illustrated in FIG. 4, the thin optical waveguide layer may comprise laminations of both a cladding layer in contact directly with the first insulation layer and an optical absorption layer in contact directly with the second insulation layer. In this case, majority parts of the light propagating through the thin optical waveguide are confined in the optical absorption layer with slight permeation of the light into the cladding layer. The first insulation layer allows a remarkable reduction in thickness of the cladding layer because the first insulation layer is capable of reflecting the light having been permeating into the cladding layer. Namely, even the thickness of the cladding layer is much thinner than a critical thickness corresponding to a depth of permeation of the light into the cladding layer, the first insulation layer is capable of reflecting the light having been permeating into the first cladding layer. Since the second insulation layer in contact directly with the optical absorption layer is also capable of reflecting the light at the interface of the optical absorption layer to the second insulation layer without permeation of the light into the second insulation layer As a result, the majority parts of the light propagating through the thin optical waveguide layer are confined within the optical absorption layer. This structure provides a high absorption coefficient to the optical absorption layer. If, for example, the depth of permeation of the light into the first and second cladding layers is 1.0 micrometer, then the thickness of the cladding layer has a thickness of less than 1.0 micrometer. Preferably, each of the first and second insulation layers has a thickness of less than 0.5 micrometers. More preferably, each of the first and second insulation layers has a thickness of less than 0.2 micrometers. It is available that the optical absorption layer comprises an Si/SiGe multiple quantum well absorption layer and the first and second cladding layers comprise impurity doped Si epitaxial layers.

Further, the first and second insulation layers may preferably comprise a silicon oxide layer or a silicon nitride layer, although the first and second insulation layers may be made of other insulation materials having a refractive index much lower than any parts of the thin optical waveguide layer.

The sixth present invention provides a planar Si-based semiconductor photodetector comprising the following elements. A first Si-based insulation layer is provided which extends over a substrate. A first Si-based cladding layer is provided which extends over the first insulation layer. The first cladding layer has a groove with a flat bottom. An Si/SiGe-based optical absorption layer is buried within the groove except for an upper region of the groove. A second Si-based cladding layer is provided on the Si/SiGe-based optical absorption layer. The second Si-based cladding layer is buried in the upper region of the groove so that a top surface of the second Si-based cladding layer has the same level as a top surface of the first Si-based cladding layer. Laminations of the Si/SiGe-based optical absorption layer and the first and second Si-based cladding layers are in the form of a thin optical waveguide layer. A second Si-based insulation layer is provided which extends over the top surfaces of the first and second Si-based cladding layers. The second Si-based insulation layer has contact holes through which electrodes are made into contact with the second Si-based cladding layer. Each of the first and second Si-based insulation layers is lower in refractive index than any parts of the Si-based thin optical waveguide layer so that a light be propagated through the Si-based thin optical waveguide layer with reflection at the first and second interfaces and without any permeation into the first and second Si-based insulation layers.

In this case, as illustrated in FIG. 3, majority parts of the light propagating through the optical waveguide are confined in the optical absorption layer with slight permeation of the light into the first and second cladding layers. The first and second insulation layers allow a remarkable reduction in thickness of the first and second cladding layers because the first and second insulation layers are capable of reflecting the light having been permeating into the first and second cladding layers. Namely, even the thicknesses of the first and second cladding layers are much thinner than a critical thickness corresponding to a depth of permeation of the light into the first and second cladding layers, the first and second insulation layers are capable of reflecting the light having been permeating into the first and second cladding layers so that the majority parts of the light propagating through the optical waveguide layer are confined within the optical absorption layer. This structure provides a high absorption coefficient to the optical absorption layer. If, for example, the depth of permeation of the light into the first and second cladding layers is 1.0 micrometer, then the thickness of each of the first and second cladding layers has a thickness of less than 1.0 micrometer. Preferably, each of the first and second insulation layers has a thickness of less than 0.5 micrometers. More preferably, each of the first and second insulation layers has a thickness of less than 0.2 micrometers. It is available that the optical absorption layer comprises an Si/SiGe multiple quantum well absorption layer and the first and second cladding layers comprise impurity doped Si epitaxial layers. In order to further increase the absorption coefficient of the absorption layer, it is effective that the first and second cladding layers have substantially the same thickness and substantially the same refractive index, and further the first and second insulation layers also have substantially the same thickness and substantially the same refractive index so as to obtain a symmetrical refractive index profile in a direction perpendicular to the interfaces of the optical waveguide layer to the first and second insulation layers.

In order to further increase the absorption coefficient of the absorption layer, it is effective the first and second cladding layers have substantially the same thickness and substantially the same refractive index, and further the first and second insulation layers also have substantially the same thickness and substantially the same refractive index so as to obtain a symmetrical refractive index profile in a direction perpendicular to the interfaces of the optical waveguide layer to the first and second insulation layers.

Further, the first and second insulation layers may preferably comprise a silicon oxide layer or a silicon nitride layer, although the first and second insulation layers may be made of other insulation materials having a refractive index much lower than any parts of the optical waveguide layer.

The seventh present invention provides a mesa-structured Si-based semiconductor photodetector comprising the following elements. A first Si-based insulation layer is provided which extends over a substrate. A first Si-based cladding layer is provided which extends over the first insulation layer. The first Si-based cladding layer has recessed portions and a mesa structured portion surrounded by the recessed portions. An Si/SiGe-based optical absorption layer is provided on the mesa structured portion of the first Si-based cladding layer. A second Si-based cladding layer is provided on the Si/SiGe-based optical absorption layer so that laminations of the first Si-based cladding layer. The Si/SiGe-based optical absorption layer and the second Si-based cladding layer are in the form of a mesa structure. The Si/SiGe-based optical absorption layer and the first and second Si-based cladding layers are in the form of a thin optical waveguide layer. A second Si-based insulation layer is provided which extends over the recessed portions of the first Si-based cladding layer and over side walls and a top surface of the mesa structure. The second Si-based insulation layer has contact holes through which electrodes are made into contact with the second Si-based cladding layer. Each of the first and second Si-based insulation layers is lower in refractive index than any parts of the Si-based thin optical waveguide layer so that a light be propagated through the Si-based thin optical waveguide layer with reflection at the first and second interfaces and without any permeation into the first and second Si-based insulation layers.

In this case, as illustrated in FIG. 3, majority parts of the light propagating through the optical waveguide are confined in the optical absorption layer with slight permeation of the light into the first and second cladding layers. The first and second insulation layers allow a remarkable reduction in thickness of the first and second cladding layers because the first and second insulation layers are capable of reflecting the light having been permeating into the first and second cladding layers. Namely, even the thicknesses of the first and second cladding layers are much thinner than a critical thickness corresponding to a depth of permeation of the light into the first and second cladding layers, the first and second insulation layers are capable of reflecting the light having been permeating into the first and second cladding layers so that the majority parts of the light propagating through the optical waveguide layer are confined within the optical absorption layer. This structure provides a high absorption coefficient to the optical absorption layer. If, for example, the depth of permeation of the light into the first and second cladding layers is 1.0 micrometer, then the thickness of each of the first and second cladding layers has a thickness of less than 1.0 micrometer. Preferably, each of the first and second insulation layers has a thickness of less than 0.5 micrometers. More preferably, each of the first and second insulation layers has a thickness of less than 0.2 micrometers. It is available that the optical absorption layer comprises an Si/SiGe multiple quantum well absorption layer and the first and second cladding layers comprise impurity doped Si epitaxial layers. In order to further increase the absorption coefficient of the absorption layer, it is effective that the first and second cladding layers have substantially the same thickness and substantially the same refractive index, and further the first and second insulation layers also have substantially the same thickness and substantially the same refractive index so as to obtain a symmetrical refractive index profile in a direction perpendicular to the interfaces of the optical waveguide layer to the first and second insulation layers In order to further increase the absorption coefficient of the absorption layer, it is effective the first and second cladding layers have substantially the same thickness and substantially the same refractive index, and further the first and second insulation layers also have substantially the same thickness and substantially the same refractive index so as to obtain a symmetrical refractive index profile in a direction perpendicular to the interfaces of the optical waveguide layer to the first and second insulation layers.

Further, the first and second insulation layers may preferably comprise a silicon oxide layer or a silicon nitride layer, although the first and second insulation layers may be made of other insulation materials having a refractive index much lower than any parts of the optical waveguide layer.

The eighth present invention provides a planar Si-based semiconductor photodetector comprising the following elements. A first Si-based insulation layer is provided which extends over a substrate. An Si-based cladding layer is provided which extends over the first Si-based insulation layer. The Si-based cladding layer has a groove with a flat bottom. An Si/SiGe-based optical absorption layer is buried within the groove so that a top surface of the Si/SiGe-based optical absorption layer has the same level as a top surface of the Si-based cladding layer. Laminations of the Si/SiGe-based optical absorption layer and the Si-based cladding layers are in the form of a thin optical waveguide layer. A second Si-based insulation layer is provided which extends over the top surface of the Si-based cladding layer and the top surface of the Si/SiGe-based optical absorption layer. The second Si-based insulation layer having contact holes through which electrodes are made into contact with the Si/SiGe-based optical absorption layer Each of the first and second Si-based insulation layers is lower in refractive index than any parts of the Si-based thin optical waveguide layer so that a light be propagated through the Si-based thin optical waveguide layer with reflection at the first and second interfaces and without any permeation into the first and second Si-based insulation layers In this case, as illustrated in FIG. 4, majority parts of the light propagating through the optical waveguide are confined in the Si/SiGe-based optical absorption layer with slight permeation of the light into the impurity doped Si cladding layer. The first Si-based insulation layer allows a remarkable reduction in thickness of the impurity doped Si cladding layer because the first Si-based insulation layer is capable of reflecting the light having been permeating into the impurity doped Si cladding layer. Namely, even the thickness of the impurity doped Si cladding layer is much thinner than a critical thickness corresponding to a depth of permeation of the light into the impurity doped Si cladding layer, the first Si-based insulation layer is capable of reflecting the light having been permeating into the first impurity doped Si cladding layer. Since the second Si-based insulation layer in contact directly with the Si/SiGe-based optical absorption layer is also capable of reflecting the light at the interface of the Si/SiGe-based optical absorption layer to the second Si-based insulation layer without permeation of the light into the second Si-based insulation layer. As a result, the majority parts of the light propagating through the Si-based thin optical waveguide layer are confined within the Si/SiGe-based optical absorption layer. This structure provides a high absorption coefficient to the Si/SiGe-based optical absorption layer. If, for example, the depth of permeation of the light into the first and second impurity doped Si cladding layers is 1.0 micrometer, then the thickness of the impurity doped Si cladding layer has a thickness of less than 1.0 micrometer. Preferably, the insulation layer has a thickness of less than 0.5 micrometers. More preferably, the insulation layer has a thickness of less than 0.2 micrometers. It is available that the Si/SiGe-based optical absorption layer comprises an Si/SiGe multiple quantum well absorption layer and the first and second impurity doped Si cladding layers comprise impurity doped Si epitaxial layers.

Further, the first and second Si-based insulation layers may preferably comprise a silicon oxide layer or a silicon nitride layer, although the first and second Si-based insulation layers may be made of other insulation materials having a refractive index much lower than any parts of the Si-based thin optical waveguide layer.

The ninth present invention provides a mesa-structured Si-based semiconductor photodetector comprising the following elements. A first Si-based insulation layer is provided which extends over a substrate. An Si-based cladding layer is provided which extends over the first Si-based insulation layer. The Si-based cladding layer has recessed portions and a mesa structured portion surrounded by the recessed portions. An Si/SiGe-based optical absorption layer is provided on the mesa structured portion of the Si-based cladding layer so that laminations of the Si-based cladding layer and the Si/SiGe-based optical absorption layer are in the form of a mesa structure. The Si/SiGe-based optical absorption layer and the Si-based cladding layer are in the form of a thin optical waveguide layer. A second Si-based insulation layer is provided which extends over the recessed portions of the Si-based cladding layer and over side walls and a top surface of the mesa structure. The second Si-based insulation layer having contact holes through which electrodes are made into contact with the second Si-based cladding layer. Each of the first and second Si-based insulation layers is lower in refractive index than any parts of the Si-based thin optical waveguide layer so that a light be propagated through the Si-based thin optical waveguide layer with reflection at the first and second interfaces and without any permeation into the first and second Si-based insulation layers.

In this case, as illustrated in FIG. 4, majority parts of the light propagating through the optical waveguide are confined in the Si/SiGe-based optical absorption layer with slight permeation of the light into the impurity doped Si cladding layer. The first Si-based insulation layer allows a remarkable reduction in thickness of the impurity doped Si cladding layer because the first Si-based insulation layer is capable of reflecting the light having been permeating into the impurity doped Si cladding layer. Namely, even the thickness of the impurity doped Si cladding layer is much thinner than a critical thickness corresponding to a depth of permeation of the light into the impurity doped Si cladding layer, the first Si-based insulation layer is capable of reflecting the light having been permeating into the first impurity doped Si cladding layer. Since the second Si-based insulation layer in contact directly with the Si/SiGe-based optical absorption layer is also capable of reflecting the light at the interface of the Si/SiGe-based optical absorption layer to the second Si-based insulation layer without permeation of the light into the second Si-based insulation layer. As a result, the majority parts of the light propagating through the Si-based thin optical waveguide layer are confined within the Si/SiGe-based optical absorption layer. This structure provides a high absorption coefficient to the Si/SiGe-based optical absorption layer. If, for example, the depth of permeation of the light into the first and second impurity doped Si cladding layers is 1.0 micrometer, then the thickness of the impurity doped Si cladding layer has a thickness of less than 1.0 micrometer. Preferably, the insulation layer has a thickness of less than 0.5 micrometers. More preferably, the insulation layer has a thickness of less than 0.2 micrometers. It is available that the Si/SiGe-based optical absorption layer comprises an Si/SiGe multiple quantum well absorption layer and the first and second impurity doped Si cladding layers comprise impurity doped Si epitaxial layers.

Further, the first and second Si-based insulation layers may preferably comprise a silicon oxide layer or a silicon nitride layer, although the first and second Si-based insulation layers may be made of other insulation materials having a refractive index much lower than any parts of the Si-based thin optical waveguide layer.

PREFERRED EMBODIMENTS

First Embodiment

Figure 6:
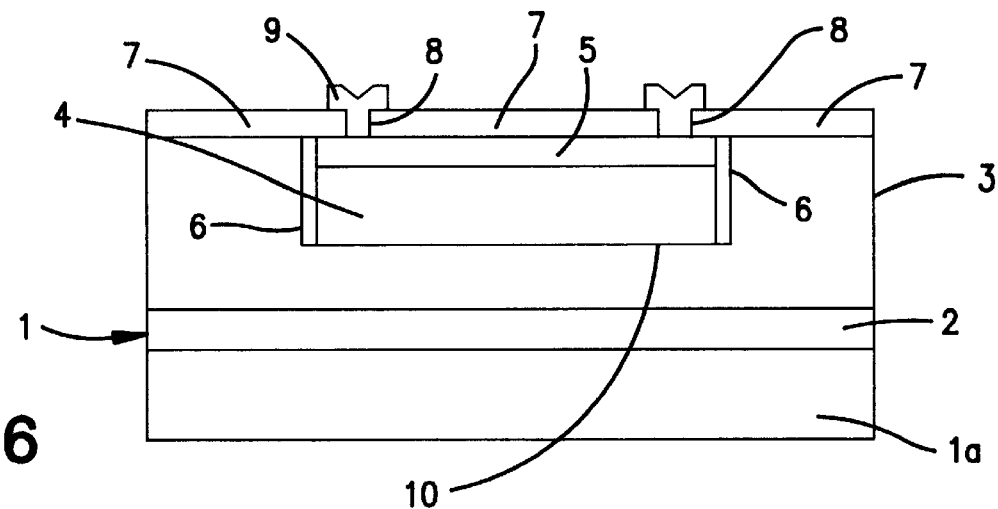
FIG. 6 is a fragmentary cross sectional elevation view illustrative of a novel planer Si-based semiconductor photodetector in a first embodiment according to the present invention.

A first embodiment according to the present invention will be described in detail with reference to FIG. 6 which is a fragmentary cross sectional elevation view illustrative of a novel planer Si-based photodetector 1 with a thin optical waveguide layer formed on a silicon-on-insulator substrate in a first embodiment according to the present invention.

A silicon oxide film 2 is formed which extends over an insulation substrate 1a. An n-type silicon layer 3 is formed which extends over the silicon oxide film 2. A trench groove 10 is formed at a center axis of the n-type silicon layer 3. Silicon oxide films 6 are formed on vertical side walls of the trench groove 10. An optical absorption layer 4 is epitaxially grown on the bottom surface of the trench groove 10 so that the optical absorption layer 4 is buried within the trench groove 10 except for an upper region of the trench groove 10. A p-type silicon layer 5 is subsequently and epitaxially grown on the optical absorption layer 4 so that the top surface of the p-type silicon layer 5 has the same level as the top surface of the n-type silicon layer 3. A silicon oxide film 7 is provided which extends over the top surfaces of the p-type silicon layer 5 and the n-type silicon layer 3. The silicon oxide film 7 has contact holes 8 through which electrodes 9 are made into contact with the p-type silicon layer 5.

The following descriptions will be concerned with the fabrication processes for the above novel planer semiconductor photodetector.

Figure 7A:
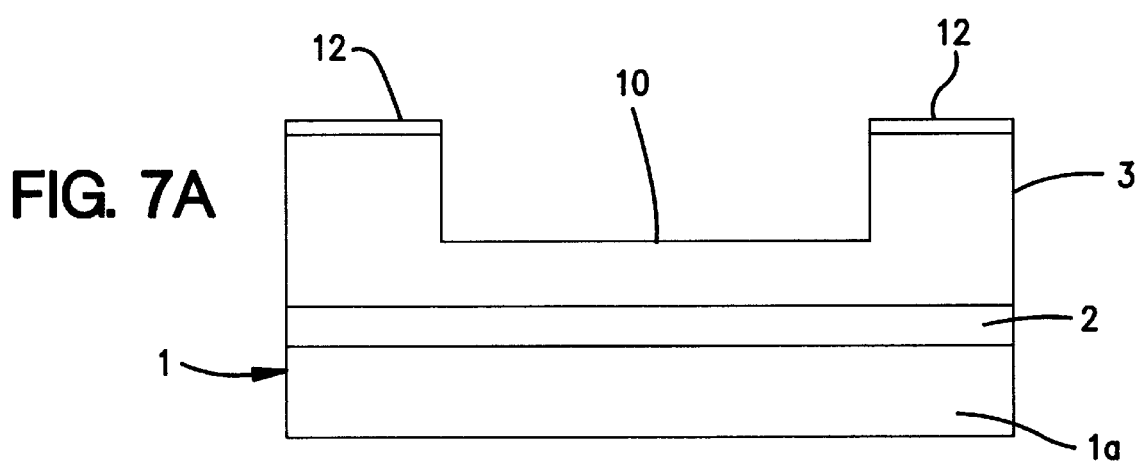
FIGS. 7A through 7D are fragmentary cross sectional elevation views illustrative of novel planer Si-based semiconductor photodetectors in sequential steps involved in a novel fabrication method in a first embodiment according to the present invention.

With reference to FIG. 7A, the silicon oxide film 2 is formed over the top surface of the insulation substrate 1a. The n-type silicon layer 3 is formed over the top surface of the silicon oxide film 2. The n-type silicon layer 3 has an impurity concentration of 1E17 cm–3. The trench groove 10 is formed by etching the n-type silicon layer 3 with use of a silicon oxide film 12 as a mask so that the trench groove 10 has a depth of 1–2 micrometers.

Figure 7B:
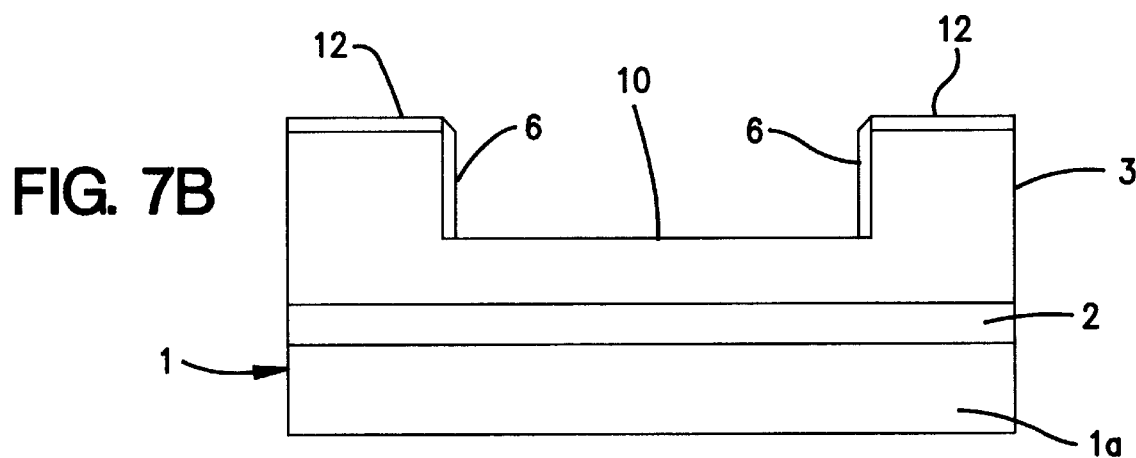

With reference to FIG. 7B, a silicon oxide film 6 is selectively formed by a low pressure chemical vapor deposition on a bottom surface and side walls of the trench groove 10. Subsequently, only the silicon oxide film 6 formed on the bottom surface of the trench groove 10 is removed by etch-back to leave the silicon oxide film 6 only on the side walls of the trench groove 10 so as to have the bottom surface of the trench groove shown.

Figure 7C:
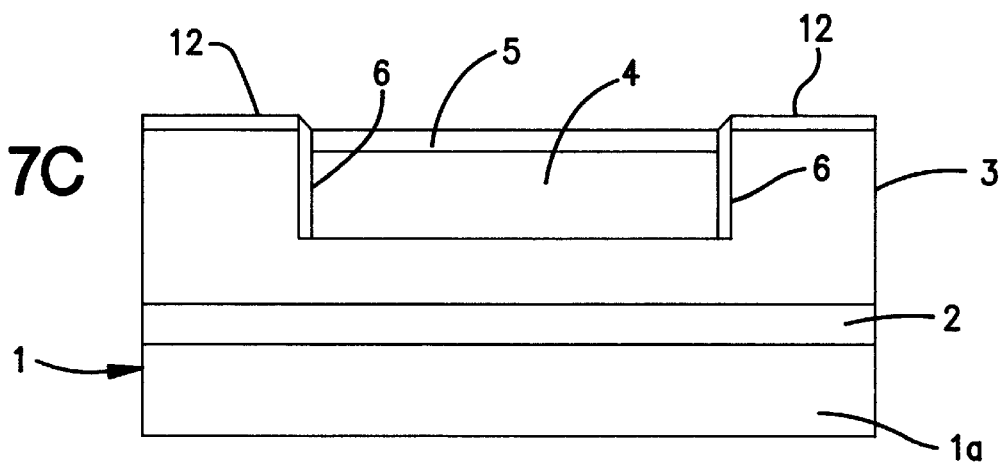

With reference to FIG. 7C, an Si/SiGe optical absorption layer 4 is selectively and epitaxially grown on the bottom surface of the trench groove 10 by use of the silicon oxide films 6 and 12 as masks. The Si/SiGe optical absorption layer 4 is an intrinsic layer free of impurity. The Si/SiGe optical absorption layer 4 comprises alternating laminations of Si layers and SiGe layers. A p-type silicon layer 5 is subsequently selectively and epitaxially grown on the Si/SiGe optical absorption layer 4. The silicon oxide film 6 on the side walls of the trench groove 10 serves to prevent epitaxial growth in the lateral direction from the vertical side wall and to allow the selective epitaxial growth in the vertical direction from the bottom surface of the trench groove 10. The p-type silicon layer 5 has a high impurity concentration of not less than 1E19 cm–3. The above selective epitaxial growth of the p-type silicon layer 5 is continued until the top surface of the p-type silicon layer 5 has the same level as the top surface of the n-type silicon layer 3.

Figure 7D:
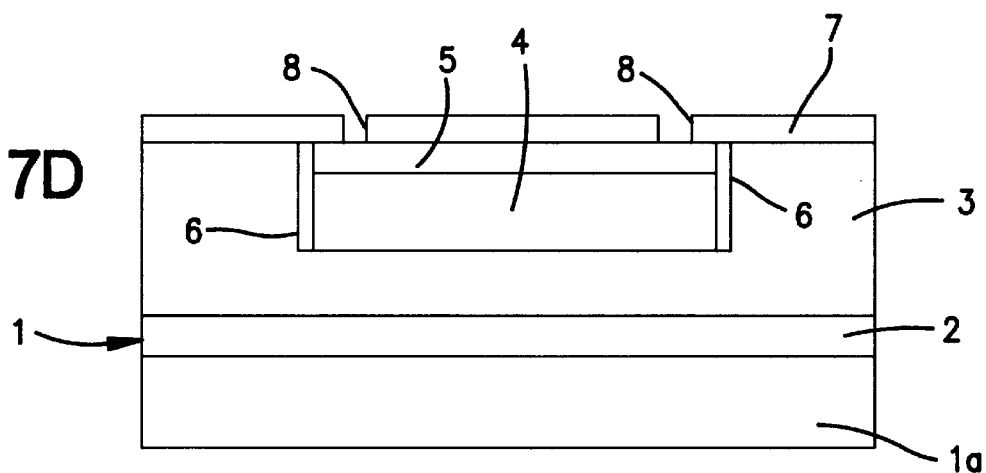

With reference to FIG. 7D, the silicon oxide film 12 is removed. A silicon oxide film 7 is then grown over the leveled top surfaces of the n-type silicon layer 3 and the p-type silicon layer 5. Contact holes 8 are formed in the silicon oxide film 7. Aluminum electrodes are formed to be made into contact through the contact holes 8 to the p-type silicon layer 5. Since as described above the p-type silicon layer 5 has the high impurity concentration of not less than 1E19 cm–3, the contact resistance of the aluminum electrodes to the p-type silicon layer 5 is low. It is preferable that the contact area of the p-type silicon layer 5 with the aluminum electrodes is small. It is sufficient that the silicon oxide film 2 has a thickness of 0.5 micrometers and the silicon oxide film 7 has a thickness of 0.2 micrometers.

Figure 8:
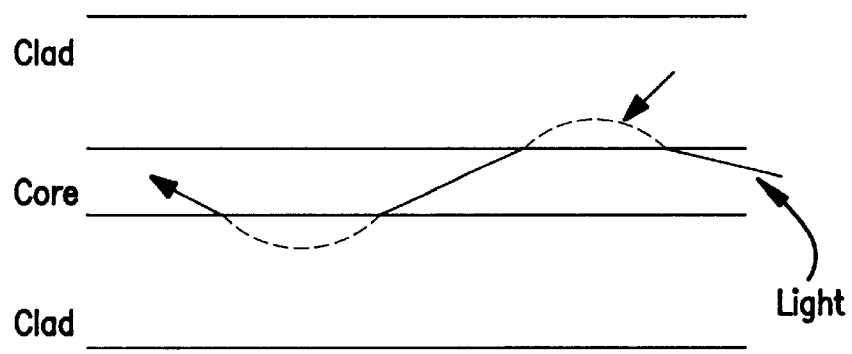
FIG. 8 is a view illustrative of a light propagating in a core layer surrounded or sandwiched by cladding layers wherein the light shows permeation into the cladding layers.

As illustrated in FIG. 8, a difference in refractive index between the n-type and p-type silicon layers 3 and 5 acting as the cladding layer and the Si/SiGe optical absorption layer 4 acting as a core layer is small. Silicon has a refractive index of about 3.5, whilst SiGe has a refractive index of about 3.6. Such the small difference in refractive index between the core layer 4 and the cladding layers 3 and 5 allows a remarkable permeation of the light into the cladding layers 3 and 5 in accordance with Goose-Henshen Shift Phenomenon. The depth of the permeation of the light into the cladding layers 3 and 5 is about 1 micrometer. In order to prevent the optical loss, each of the cladding layers 3 and 5 must have a thickness thicker than the depth of permeation of the light into the cladding layers 3 and 5, for example, more than 1 micrometer. In contrast, according to the present invention, the silicon oxide layers 2 and 7 sandwich the optical waveguide layer comprising laminations of the Si/SiGe optical absorption layer 4 and the n-type and p-type Si cladding layers 3 and 5. Silicon oxide has a refractive index of about 1.5 which is much lower than those of the n-type and p-type Si cladding layers 3 and 5 and the Si/SiGe optical absorption layer 4. This means that the silicon oxide layers 2 and 7 can serve as reflecting layers which are capable of reflecting the light without any permeation of the light into the silicon oxide layers 2 and 7. This allows that even if the n-type and p-type Si cladding layers 3 and 5 have a thickness less than 1 micrometer or the depth of the permeation of the high into the Si cladding layers 3 and 5, then the light having been permeated in the n-type and p-type Si cladding layers 3 and 5 arrives the interfaces of the silicon oxide layers 2 and 7 to the n-type and p-type Si cladding layers 3 and 5 whereby, however, the silicon oxide layers 2 and 7 serve to reflect the light having been permeated in the n-type and p-type Si cladding layers 3 and 5 without any further permeation of the light into the silicon oxide layers 2 and 7. As a result, the light is well confined in the optical waveguide layer even though the cladding layers sandwiching the optical absorption layer are thinner than 1 micrometer or the depth of the permeation of the high into the Si cladding layers 3 and 5. The silicon oxide layers 2 and 7 permits the optical waveguide layer to have a remarkably reduced thickness of about 2000 angstroms.

Second Embodiment

Figure 9:
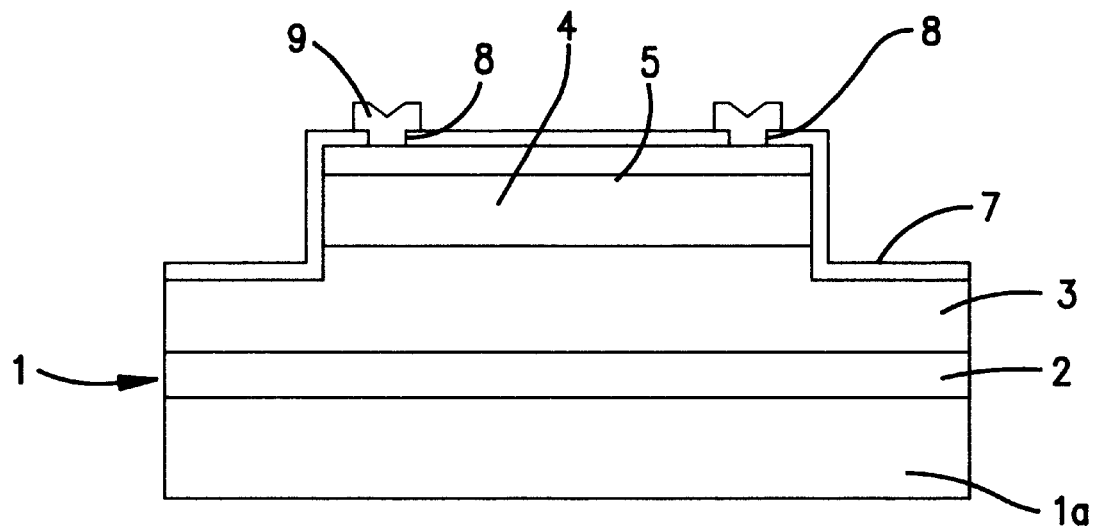
FIG. 9 is a fragmentary cross sectional elevation view illustrative of a novel mesa-structure Si-based semiconductor photodetector in a second embodiment according to the present invention.

A second embodiment according to the present invention will be described in detail with reference to FIG. 9 which is a fragmentary cross sectional elevation view illustrative of a novel mesa-structure Si-based photodetector 1 with a thin optical waveguide layer formed on a silicon-on-insulator substrate in a second embodiment according to the present invention.

A silicon oxide film 2 is formed which extends over an insulation substrate 1a. An n-type silicon layer 3 is formed which extends over the silicon oxide film 2. The n-type silicon layer 3 has a recessed portion surrounding a mesa portion having a higher level than the recessed portion. An optical absorption layer 4 is epitaxially grown on the mesa portion of the n-type silicon layer 3. A p-type silicon layer 5 is subsequently and epitaxially grown on the optical absorption layer 4 whereby the mesa portion of the n-type silicon layer 3, the optical absorption layer 4 and the p-type silicon layer 5 are in the form of a mesa structure. A silicon oxide film 7 is provided which extends over the recessed portion of the n-type silicon layer 3 as well as over the top surface and the vertical side walls of the mesa stricture. The silicon oxide film 7 has contact holes 8 through which electrodes 9 are made into contact with the p-type silicon layer 5.

The following descriptions will be concerned with the fabrication processes for the above novel mesa-stricture semiconductor photodetector. The silicon oxide film 2 is formed over the top surface of the insulation substrate 1a. The n-type silicon layer 3 is formed over the top surface of the silicon oxide film 2. The n-type silicon layer 3 has an impurity concentration of 1E17 cm-3. The Si/SiGe optical absorption layer 4 is epitaxially grown on the top surface of the n-type silicon layer 3. The Si/SiGe optical absorption layer 4 is an intrinsic layer free of impurity. The Si/SiGe optical absorption layer 4 comprises alternating laminations of Si layers and SiGe layers. A p-type silicon layer 5 is subsequently and epitaxially grown on the Si/SiGe optical absorption layer 4. The p-type silicon layer 5 has a high impurity concentration of not less than 1E19 cm-3. The laminations of the n-type silicon layer 3, the Si/SiGe optical absorption layer 4 and the p-type silicon layer 5 are selectively etched to form the above mesa structure. A silicon oxide film 7 is then grown over the recessed portion of the n-type silicon layer 3 as well as over the vertical side walls and the top surface of the mesa structure. Contact holes 8 are formed in the silicon oxide film 7. Aluminum electrodes are formed to be made into contact through the contact holes 8 to the p-type silicon layer 5. Since as described above the p-type silicon layer 5 has the high impurity concentration of not less than 1E19 cm-3, the contact resistance of the aluminum electrodes to the p-type silicon layer 5 is low. It is preferable that the contact area of the p-type silicon layer 5 with the aluminum electrodes is small. It is sufficient that the silicon oxide film 2 has a thickness of 0.5 micrometers and the silicon oxide film 7 has a thickness of 0.2 micrometers.

As illustrated in FIG. 8, a difference in refractive index between the n-type and p-type silicon layers 3 and 5 acting as the cladding layer and the Si/SiGe optical absorption layer 4 acting as a core layer is small Silicon has a refractive index of about 3.5, whilst SiGe has a refractive index of about 3.6. Such the small difference in refractive index between the core layer 4 and the cladding layers 3 and 5 allows a remarkable permeation of the light into the cladding layers 3 and 5 in accordance with Goose-Henshen Shift Phenomenon. The depth of the permeation of the light into the cladding layers 3 and 5 is about 1 micrometer. In order to prevent the optical loss, each of the cladding layers 3 and 5 must have a thickness thicker than the depth of permeation of the light into the cladding layers 3 and 5, for example, more than 1 micrometer. In contrast, according to the present invention, the silicon oxide layers 2 and 7 sandwich the optical waveguide layer comprising laminations of the Si/SiGe optical absorption layer 4 and the n-type and p-type Si cladding layers 3 and 5. Silicon oxide has a refractive index of about 1.5 which is much lower than those of the n-type and p-type Si cladding layers 3 and 5 and the Si/SiGe optical absorption layer 4. This means that the silicon oxide layers 2 and 7 can serve as reflecting layers which are capable of reflecting the light without any permeation of the light into the silicon oxide layers 2 and 7. This allows that even if the n-type and p-type Si cladding layers 3 and 5 have a thickness less than 1 micrometer or the depth of the permeation of the high into the Si cladding layers 3 and 5, then the light having been permeated in the n-type and p-type Si cladding layers 3 and 5 arrives the interfaces of the silicon oxide layers 2 and 7 to the n-type and p-type Si cladding layers 3 and 5 whereby, however, the silicon oxide layers 2 and 7 serve to reflect the light having been permeated in the n-type and p-type Si cladding layers 3 and 5 without any further permeation of the light into the silicon oxide layers 2 and 7. As a result, the light is well confined in the optical waveguide layer even though the cladding layers sandwiching the optical absorption layer are thinner than 1 micrometer or the depth of the permeation of the high into the Si cladding layers 3 and 5. The silicon oxide layers 2 and 7 permits the optical waveguide layer to have a remarkably reduced thickness of about 2000 angstroms. This means that the step or the height of the mesa structure is remarkably reduced.

Third Embodiment

Figure 10:
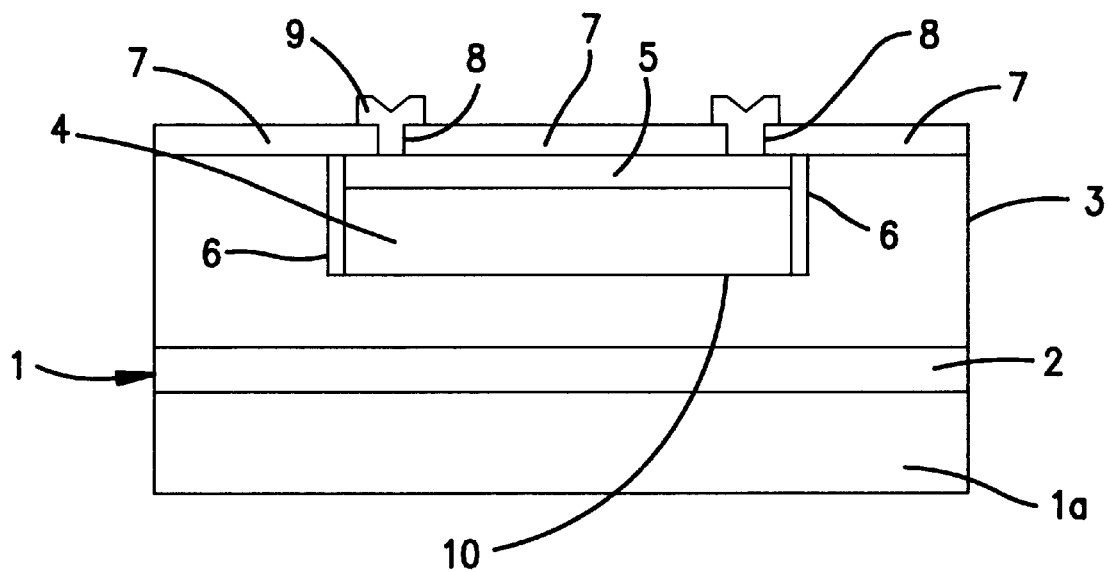
FIG. 10 is a fragmentary cross sectional elevation view illustrative of another novel planer Si-based semiconductor photodetector in a third embodiment according to the present invention.

A third embodiment according to the present invention will be described in detail with reference to FIG. 10 which is a fragmentary cross sectional elevation view illustrative of a novel planer Si-based photodetector 1 with a thin optical waveguide layer formed on a silicon-on-insulator substrate in a third embodiment according to the present invention.

A silicon oxide film 2 is formed which extends over an insulation substrate 1a. An n-type silicon layer 3 is formed which extends over the silicon oxide film 2. A trench groove 10 is formed at a center axis of the n-type silicon layer 3. Silicon oxide films 6 are formed on vertical side walls of the trench groove 10. An optical absorption layer 4 is epitaxially grown on the bottom surface of the trench groove 10 so that the optical absorption layer 4 is buried within the trench groove 10 whereby the top surface of the optical absorption layer 4 has the same level as the top surface of the n-type silicon layer 3. A silicon oxide film 7 is provided which extends over the top surfaces of the optical absorption layer 4 and the n-type silicon layer 3. The silicon oxide film 7 has contact holes 8 through which electrodes 9 are made into contact with the optical absorption layer 4.

The following descriptions will be concerned with the fabrication processes for the above novel planer semiconductor photodetector. The silicon oxide film 2 is formed over the top surface of the insulation substrate 1a. The n-type silicon layer 3 is formed over the top surface of the silicon oxide film 2 The n-type silicon layer 3 has an impurity concentration of 1E17 cm-3. The trench groove 10 is formed by etching the n-type silicon layer 3 with use of a silicon oxide film 12 as a mask so that the trench groove 10 has a depth of 1–2 micrometers. A silicon oxide film 6 is selectively formed by a low pressure chemical vapor deposition on a bottom surface and side walls of the trench groove 10. Subsequently, only the silicon oxide film 6 formed on the bottom surface of the trench groove 10 is removed by etch-back to leave the silicon oxide film 6 only on the side walls of the trench groove 10 so as to have the bottom surface of the trench groove shown. An Si/SiGe optical absorption layer 4 is selectively and epitaxially grown on the bottom surface of the trench groove 10 by use of the silicon oxide films 6 and 12 as masks so that the Si/SiGe optical absorption layer 4 is buried within the trench groove 10. The Si/SiGe optical absorption layer 4 is an intrinsic layer free of impurity. The Si/SiGe optical absorption layer 4 comprises alternating laminations of Si layers and SiGe layers. The silicon oxide film 6 on the side walls of the trench groove 10 serves to prevent epitaxial growth in the lateral direction from the vertical side wall and to allow the selective epitaxial growth in the vertical direction from the bottom surface of the trench groove 10. The above selective epitaxial growth of the optical absorption layer 4 is continued until the top surface of the optical absorption layer 4 has the same level as the top surface of the n-type silicon layer 3. The silicon oxide film 12 is removed. A silicon oxide film 7 is then grown over the leveled top surfaces of the n-type silicon layer 3 and the optical absorption layer 4. Contact holes 8 are formed in the silicon oxide film 7. Aluminum electrodes are formed to be made into contact through the contact holes 8 to the optical absorption layer 4. It is preferable that the contact area of the optical absorption layer 4 with the aluminum electrodes is small. It is sufficient that the silicon oxide film 2 has a thickness of 0.5 and the silicon oxide film 7 has a thickness of 0.2 micrometers.

As illustrated in FIG. 8, a difference in refractive index between the silicon layers acting as the cladding layer and the Si/SiGe optical absorption layer 4 acting as a core layer is small. Silicon has a refractive index of about 3.5, whilst SiGe has a refractive index of about 3.6. Such the small difference in refractive index between the core layer 4 and the cladding layer 3 allows a remarkable permeation of the light into the cladding layer 3 in accordance with Goose-Henshen Shift Phenomenon. The depth of the permeation of the light into the cladding layer 3 is about 1 micrometer. In order to prevent the optical loss, the cladding layer 3 must have a thickness thicker than the depth of permeation of the light into the cladding layer 3, for example, more than 1 micrometer. In contrast, according to the present invention, the silicon oxide layers 2 and 7 sandwich the optical waveguide layer comprising laminations of the Si/SiGe optical absorption layer 4 and the n-type Si cladding layer 3. Silicon oxide has a refractive index of about 1.5 which is much lower than those of the n-type Si cladding layer 3 and the Si/SiGe optical absorption layer 4. This means that the silicon oxide layers 2 and 7 can serve as reflecting layers which are capable of reflecting the light without any permeation of the light into the silicon oxide layers 2 and 7. This allows that even if the n-type Si cladding layer 3 has a thickness less than 1 micrometer or the depth of the permeation of the high into the Si cladding layer 3, then the light having been permeated in the n-type Si cladding layer 3 arrives the interfaces of the silicon oxide layers 2 and 7 to the n-type and p-type Si cladding layer 3 whereby, however, the silicon oxide layers 2 and 7 serve to reflect the light having been permeated in the n-type and p-type Si cladding layer 3 without any further permeation of the light into the silicon oxide layers 2 and 7. As a result, the light is well confined in the optical waveguide layer even though the cladding layers sandwiching the optical absorption layer are thinner than 1 micrometer or the depth of the permeation of the high into the Si cladding layer 3. The silicon oxide layers 2 and 7 permits the optical waveguide layer to have a remarkably reduced thickness of about 2000 angstroms.

Fourth Embodiment

Figure 11:
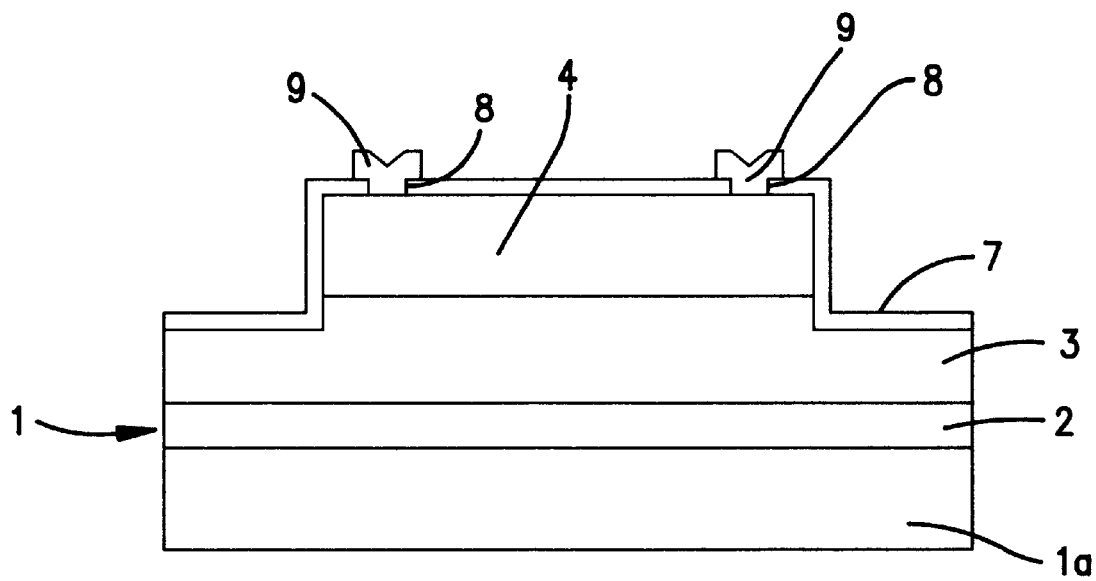
FIG. 11 is a fragmentary cross sectional elevation view illustrative of another novel mesa-structure Si-based semiconductor photodetector in a fourth embodiment according to the present invention.

A fourth embodiment according to the present invention will be described in detail with reference to FIG. 11 which is a fragmentary cross sectional elevation view illustrative of a novel mesa-structure Si-based photodetector 1 with a thin optical waveguide layer formed on a silicon-on-insulator substrate in a fourth embodiment according to the present invention.

A silicon oxide film 2 is formed which extends over an insulation substrate 1a. An n-type silicon layer 3 is formed which extends over the silicon oxide film 2. The n-type silicon layer 3 has a recessed portion surrounding a mesa portion having a higher level than the recessed portion. An optical absorption layer 4 is epitaxially grown on the mesa portion of the n-type silicon layer 3 whereby the mesa portion of the n-type silicon layer 3 and the optical absorption layer 4 are in the form of a mesa structure. A silicon oxide film 7 is provided which extends over the recessed portion of the n-type silicon layer 3 as well as over the top surface and the vertical side walls of the mesa stricture. The silicon oxide film 7 has contact holes 8 through which electrodes 9 are made into contact with the optical absorption layer 4.

The following descriptions will be concerned with the fabrication processes for the above novel mesa-structure semiconductor photodetector. The silicon oxide film 2 is formed over the top surface of the insulation substrate 1a. The n-type silicon layer 3 is formed over the top surface of the silicon oxide film 2. The n-type silicon layer 3 has an impurity concentration of 1E17 cm−3. The Si/SiGe optical absorption layer 4 is epitaxially grown on the top surface of the n-type silicon layer 3. The Si/SiGe optical absorption layer 4 is an intrinsic layer free of impurity. The Si/SiGe optical absorption layer 4 comprises alternating laminations of Si layers and SiGe layers. The laminations of the n-type silicon layer 3 and the Si/SiGe optical absorption layer 4 are selectively etched to form the above mesa structure. A silicon oxide film 7 is then grown over the recessed portion of the n-type silicon layer 3 as well as over the vertical side walls and the top surface of the mesa structure. Contact holes 8 are formed in the silicon oxide film 7. Aluminum electrodes are formed to be made into contact through the contact holes 8 to the p-type silicon layer 5. It is preferable that the contact area of the Si/SiGe optical absorption layer 4 with the aluminum electrodes is small. It is sufficient that the silicon oxide film 2 has a thickness of 0.5 micrometers and the silicon oxide film 7 has a thickness of 0.2 micrometers.

As illustrated in FIG. 8, a difference in refractive index between the n-type and p-type silicon layers acting as the cladding layer and the Si/SiGe optical absorption layer 4 acting as a core layer is small. Silicon has a refractive index of about 3.5, whilst SiGe has a refractive index of about 3.6. Such the small difference in refractive index between the core layer 4 and the cladding layers 3 and 5 allows a remarkable permeation of the light into the cladding layer 3 in accordance with Goose-Henshen Shift Phenomenon. The depth of the permeation of the light into the cladding layer 3 is about 1 micrometer. In order to prevent the optical loss, the cladding layer 3 must have a thickness thicker than the depth of permeation of the light into the cladding layer 3, for example, more than 1 micrometer. In contrast, according to the present invention, the silicon oxide layers 2 and 7 sandwich the optical waveguide layer comprising laminations of the Si/SiGe optical absorption layer 4 and the n-type Si cladding layer 3. Silicon oxide has a refractive index of about 1.5 which is much lower than those of the n-type Si cladding layer 3 and the Si/SiGe optical absorption layer 4. This means that the silicon oxide layers 2 and 7 can serve as reflecting layers which are capable of reflecting the light without any permeation of the light into the silicon oxide layers 2 and 7. This allows that even if the n-type Si cladding layer 3 has a thickness less than 1 micrometer or the depth of the permeation of the high into the Si cladding layer 3, then the light having been permeated in the n-type Si cladding layer 3 arrives the interfaces of the silicon oxide layers 2 and 7 to the n-type Si cladding layer 3 whereby, however, the silicon oxide layers 2 and 7 serve to reflect the light having been permeated in the n-type Si cladding layer 3 without any further permeation of the light into the silicon oxide layers 2 and 7. As a result, the light is well confined in the optical waveguide layer even though the cladding layers sandwiching the optical absorption layer are thinner than 1 micrometer or the depth of the permeation of the high into the Si cladding layer 3. The silicon oxide layers 2 and 7 permits the optical waveguide layer to have a remarkably reduced thickness of about 2000 angstroms. This means that the step or the height of the mesa structure is remarkably reduced.

Fifth Embodiment

Figure 12:
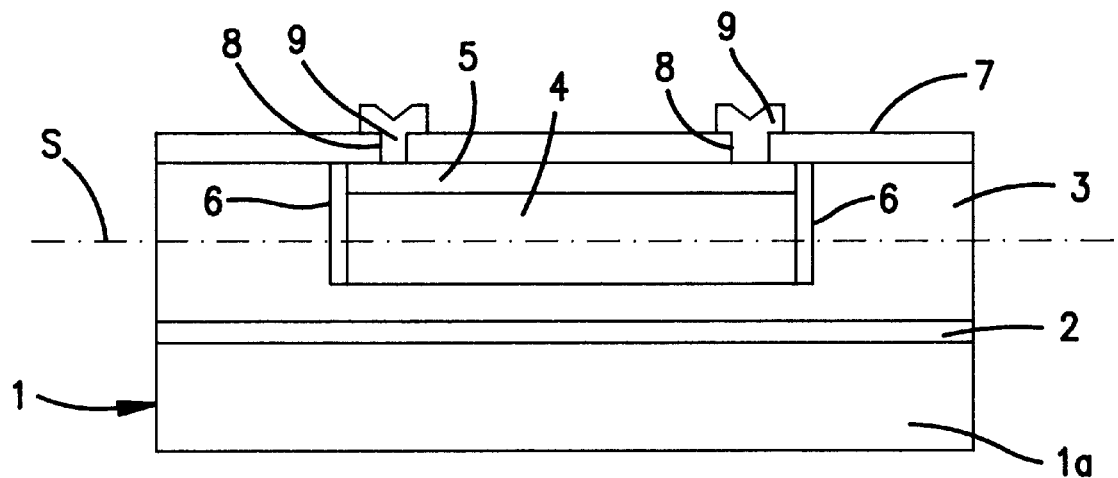
FIG. 12 is a fragmentary cross sectional elevation view illustrative of still another novel planer Si-based semiconductor photodetector in a fifth embodiment according to the present invention.

A fifth embodiment according to the present invention will be described in detail with reference to FIG. 12 which is a fragmentary cross sectional elevation view illustrative of a novel planer Si-based photodetector 1 with a thin optical waveguide layer formed on a silicon-on-insulator substrate in a first embodiment according to the present invention. The structure of the novel photodetector is the same as in the first embodiment except that the first and second cladding layers have substantially the same thickness and substantially the same refractive index, and further the first and second insulation layers also have substantially the same thickness and substantially the same refractive index so as to obtain a symmetrical refractive index profile in a direction perpendicular to the interfaces of the optical waveguide layer to the first and second insulation layers. As a result, the absorption coefficient of the optical absorption layer is increased.

A silicon oxide film 2 is formed which extends over an insulation substrate 1a. An n-type silicon layer 3 is formed which extends over the silicon oxide film 2. A trench groove 10 is formed at a center axis of the n-type silicon layer 3. Silicon oxide films 6 are formed on vertical side walls of the trench groove 10. An optical absorption layer 4 is epitaxially grown on the bottom surface of the trench groove 10 so that the optical absorption layer 4 is buried within the trench groove 10 except for an upper region of the trench groove 10. A p-type silicon layer 5 is subsequently and epitaxially grown on the optical absorption layer 4 so that the top surface of the p-type silicon layer 5 has the same level as the top surface of the n-type silicon layer 3. The p-type silicon layer 5 has the same thickness and substantially the same refractive index as the n-type silicon layer 3 in the regions contacting optical absorption layer 4. A silicon oxide film 7 is provided which extends over the top surfaces of the p-type silicon layer 5 and the n-type silicon layer 3. The silicon oxide film 7 has the same thickness and the same refractive index as the silicon oxide film 2. The silicon oxide film 7 has contact holes 8 through which electrodes 9 are made into contact with the p-type silicon layer 5.

As described above, in this embodiment, the silicon oxide films 2 and 7 have the same thickness and the same refractive index as well as the n-type and p-type silicon layers 3 and 5 acting as the cladding layers have the same thickness and the substantially the same refractive index in order to obtain a symmetrical refractive index profile. Such symmetrical refractive index profile rises the absorption coefficient.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor photodetector comprising:
an optical waveguide layer having a first interface in contact directly with a first insulation layer and a second interface in contact directly with a second insulation layer,
said waveguide layer having a width greater than a height and a length terminated with a first end into which a light to be propagated through said waveguide enters,
said waveguide having a single planar lengthwise upper surface along the width entirely covered by said first insulation layer and a single planar lengthwise lower surface along the width entirely covered by said second insulation layer,
wherein each of said first and second insulation layers is lower in refractive index than any parts of said optical waveguide layer so that the light propagated through said optical waveguide layer reflects at said first and second interfaces without any permeation into said first and second insulation layers.

2. The optical waveguide layer as claimed in claim 1, wherein said optical waveguide layer comprises an optical absorption layer.

3. The optical waveguide layer as claimed in claim 1, wherein said optical absorption layer comprises an Si/SiGe multiple quantum well absorption layer.

4. The optical waveguide layer as claimed in claim 1, wherein said optical waveguide layer comprises an optical absorption layer sandwiched by both a first cladding layer in contact directly with said first insulation layer and a second cladding layer in contact directly with said second insulation layer.

5. The optical waveguide layer as claimed in claim 4, wherein each of said first and second cladding layers has a thickness of less than 1.0 micrometer.

6. The optical waveguide layer as claimed in claim 5, wherein each of said first and second insulation layers has a thickness of less than 0.5 micrometers.

7. The optical waveguide layer as claimed in claim 4, wherein said optical absorption layer comprises an Si/SiGe multiple quantum well absorption layer and said first and second cladding layers comprise impurity doped Si epitaxial layers.

8. The optical waveguide layer as claimed in claim 4, wherein said first and second cladding layers have substantially the same thickness and substantially the same refractive index, and further said first and second insulation layers also have substantially the same thickness and substantially the same refractive index.

9. The optical waveguide layer as claimed in claim 1, wherein said optical waveguide layer comprises laminations of both a cladding layer in contact directly with said first insulation layer and an optical absorption layer in contact directly with said second insulation layer.

10. The optical waveguide layer as claimed in claim 9, wherein said cladding layer has a thickness of less than 1.0 micrometer.

11. The optical waveguide layer as claimed in claim 10, wherein each of said first and second insulation layer has a thickness of less than 0.5 micrometers.

12. The optical waveguide layer as claimed in claim 9, wherein said optical absorption layer comprises an Si/SiGe multiple quantum well absorption layer and said cladding layer comprises an impurity doped Si epitaxial layer.

13. The optical waveguide layer as claimed in claim 1, wherein said first insulation layer comprises a silicon oxide layer.

14. The optical waveguide layer as claimed in claim 1, wherein said first insulation layer comprises a silicon nitride layer.

15. The optical waveguide layer as claimed in claim 1, wherein said second insulation layer comprises a silicon oxide layer.

16. The optical waveguide layer as claimed in claim 1, wherein said second insulation layer comprises a silicon nitride layer.

17. A Si-based semiconductor photodetector comprising:
a Si-based thin optical waveguide layer having a first interface in contact directly with a first Si-based insulation layer and a second interface in contact directly with a second Si-based insulation layer,
said waveguide layer having a length terminated with a first end into which a light to be propagated through said waveguide enters,
said waveguide having a single planar lengthwise upper surface entirely covered by said first Si-based insulation layer and a single planar lengthwise lower surface entirely covered by said second Si-based insulation layer,
wherein each of said first and second Si-based insulation layers is lower in refractive index than any parts of said Si-based thin optical waveguide layer so that the light propagated through said Si-based thin optical waveguide layer reflects at said first and second interfaces without any permeation into said first and second Si-based insulation layers.

18. The Si-based thin optical waveguide layer as claimed in claim 17, wherein said Si-based thin optical waveguide layer comprises an Si/SiGe-based optical absorption layer.

19. The Si-based thin optical waveguide layer as claimed in claim 18, wherein said Si/SiGe-based optical absorption layer comprises an Si/SiGe multiple quantum well absorption layer.

20. The Si-based thin optical waveguide layer as claimed in claim 17, wherein said Si-based thin optical waveguide layer comprises an Si/SiGe-based optical absorption layer sandwiched by both a first impurity doped Si cladding layer in contact directly with said first Si-based insulation layer and a second impurity doped Si cladding layer in contact directly with said second Si-based insulation layer.

21. The Si-based thin optical waveguide layer as claimed in claim 20, wherein each of said first and second impurity doped Si cladding layers has a thickness of less than 1.0 micrometer.

22. The Si-based thin optical waveguide layer as claimed in claim 21, wherein each of said first and second insulation layers has a thickness of less than 0.5 micrometers.

23. The Si-based thin optical waveguide layer as claimed in claim 20, wherein said first and second impurity doped Si cladding layers have substantially the same thickness and substantially the same refractive index, and further said first and second Si-based insulation layers also have substantially the same thickness and substantially the same refractive index.

24. The Si-based thin optical waveguide layer as claimed in claim 17, wherein said Si-based thin optical waveguide layer comprises laminations of both an impurity doped Si cladding layer in contact directly with said first Si-based insulation layer and an Si/SiGe-based optical absorption layer in contact directly with said second Si-based insulation layer.

25. The Si-based thin optical waveguide layer as claimed in claim 24, wherein said impurity doped Si cladding layer has a thickness of less than 1.0 micrometer.

26. The Si-based thin optical waveguide layer as claimed in claim 25, wherein each of said first and second insulation layers has a thickness of less than 0.5 micrometers.

27. The Si-based thin optical waveguide layer as claimed in claim 17, wherein said first Si-based insulation layer comprises a silicon oxide layer.

28. The Si-based thin optical waveguide layer as claimed in claim 17, wherein said first Si-based insulation layer comprises a silicon nitride layer.

29. The Si-based thin optical waveguide layer as claimed in claim 17, wherein said second Si-based insulation layer comprises a silicon oxide layer.

30. The Si-based thin optical waveguide layer as claimed in claim 17, wherein said second Si-based insulation layer comprises a silicon nitride layer.

31. A Si-based semiconductor photodetector comprising:
a Si-based thin optical waveguide layer comprising an Si-SiGe multiple quantum well optical absorption layer sandwiched by both first and second impurity doped Si cladding layers,
said waveguide layer having a length terminated with a first end into which light to be propagated through said waveguide enters,
said waveguide having a single planar lengthwise upper surface entirely covered by said first cladding layer and a single planar lengthwise lower surface, parallel to said upper surface, entirely covered by said second cladding layer,
wherein said first impurity doped Si cladding layer has a first thickness of not more than 1.0 micrometer and further said first impurity doped Si cladding layer has a first interface in contact directly with a first insulation layer made of one selected from the group consisting of silicon oxide and silicon nitride, and
wherein said second impurity doped Si cladding layer has a second thickness of not more than 1.0 micrometer and further said second impurity dopes Si cladding layer has a second interface in contact directly with a second insulation layer made of one selected from the group consisting of silicon oxide and silicon nitride,
so that the light propagated through said Si-based thin optical waveguide layer reflects at said first and second interfaces without any permeation into said first and second insulation layers.

32. A Si-based semiconductor photodetector comprising:
a Si-based thin optical waveguide layer comprising laminations of both a Si/SiGe multiple quantum well optical absorption layer and an impurity doped Si cladding layer,
said absorption layer having a length terminated with a first end into which light to be propagated through said waveguide enters,
said absorption having a single planar lengthwise first surface entirely covered by said cladding layer,
wherein said impurity doped Si cladding layer has a thickness of not more than 1.0 micrometer and further said impurity doped Si cladding layer has a first interface in contact directly with a first insulation layer made of one selected from the group consisting of silicon oxide and silicon nitride, and
wherein said Si/SiGe multiple quantum well optical absorption layer has a second interface in contact directly with a second insulation layer made of one selected from the group consisting of silicon oxide and silicon nitride,
said waveguide having a single planar lengthwise second surface, parallel to said first surface, entirely covered by said second insulation layer, so that the light propagated through said Si-based thin optical waveguide layer reflects at said first and second interfaces without any permeation into said first and second insulation layers.

33. A semiconductor photodetector comprising:
a first insulation layer provided on a substrate;
a thin optical waveguide layer provided on said first insulation layer, so that said thin optical waveguide layer has a first interface in contact directly with said first insulation layer; and
a second insulation layer formed on said thin optical waveguide layer so that said thin optical waveguide layer has a second interface in contact directly with said second insulation layer, said second insulation layer having contact holes through which electrodes are in contact with said thin optical waveguide layer;
said waveguide layer having a length terminated with a first end into which a light to be propagated through said waveguide enters,
said waveguide having a single planar lengthwise first surface entirely covered by said first insulation layer and a single planar lengthwise second surface entirely covered by said second insulation layer other than at said contact holes,
wherein each of said first and second insulation layers is lower in refractive index than any parts of said thin optical waveguide layer so that the light propagated through said thin optical waveguide layer reflects at said first and second interfaces without any permeation into said first and second insulation layers.

34. The semiconductor photodetector as claimed in claim 33, wherein said thin optical waveguide layer comprises an optical absorption layer.

35. The semiconductor photodetector as claimed in claim 33, wherein said optical absorption layer comprises an Si/SiGe multiple quantum well absorption layer.

36. The semiconductor photodetector as claimed in claim 33, wherein said thin optical waveguide layer comprises an optical absorption layer sandwiched by both a first cladding layer in contact directly with said first insulation layer and a second cladding layer in contact directly with said second insulation layer.

37. The semiconductor photodetector as claimed in claim 36, wherein each of said first and second cladding layers has a thickness of less than 1.0 micrometers.

38. The semiconductor photodetector as claimed in claim 37, wherein each of the first and second insulation layers has a thickness of less than 0.5 micrometers.

39. The semiconductor photodetector as claimed in claim 36, wherein said optical absorption layer comprises an Si/SiGe multiple quantum well absorption layer and said first and second cladding layers comprise impurity doped Si epitaxial layers.

40. The semiconductor photodetector as claimed in claim 36, wherein said first and second cladding layers have substantially the same thickness and substantially the same refractive index, and further said first and second insulation layers also have substantially the same thickness and substantially the same refractive index.

41. The semiconductor photodetector as claimed in claim 33, wherein said thin optical waveguide layer comprises laminations of both a cladding layer in contact directly with said first insulation layer and an optical absorption layer in contact directly with said second insulation layer.

42. The semiconductor photodetector as claimed in claim 41, wherein each of said cladding layers has a thickness of less than 1.0 micrometer.

43. The semiconductor photodetector as claimed in claim 42 wherein said first and second insulation layers has a thickness of less than 0.5 micrometers.

44. The semiconductor photodetector as claimed in claim 41, wherein said optical absorption layer comprises an Si/SiGe multiple quantum well absorption layer and said cladding layer comprises an impurity doped Si epitaxial layer.

45. The semiconductor photodetector as claimed in claim 33, wherein said first insulation layer comprises a silicon oxide layer.

46. The semiconductor photodetector as claimed in claim 33, wherein said first insulation layer comprises a silicon nitride layer.

47. The semiconductor photodetector as claimed in claim 33, wherein said second insulation layer comprises a silicon oxide layer.

48. The semiconductor photodetector as claimed in claim 33, wherein said second insulation layer comprises a silicon nitride layer.

49. A planar Si-based semiconductor photodetector comprising:
a substrate;
a first Si-based insulation layer provided which extends over said substrate;
a first Si-based cladding layer provided which extends over and contacts said first insulation layer, said first cladding layer having a groove with a flat bottom;
an Si/SiGe-based optical absorption layer buried within said groove except for an upper region of said groove;
said Si/SiGe-based optical absorption layer having a lower surface directly contacting said flat bottom of said groove;
a second Si-based cladding layer provided on said Si/SiGe-based optical absorption layer and said second Si-based cladding layer being buried in said upper region of said groove so that a top surface of said second Si-based cladding layer has the same level as a top surface of said first Si-based cladding layer, whereby laminations of said Si/SiGe-based optical absorption layer and said first and second Si-based cladding layers are in the form of a thin optical waveguide layer; and
a second Si-based insulation layer extending over said top surfaces of said first and second Si-based cladding layers, said second Si-based insulation layer having contact holes through which electrodes are made into contact with said second Si-based cladding layer,
wherein each of said first and second Si-based insulation layers is lower in refractive index than any parts of said Si-based thin optical waveguide layer so that a light propagated through said Si-based thin optical waveguide layer reflects at said first and second interfaces without any permeation into said first and second Si-based insulation layers.

50. The planar Si-based semiconductor photodetector as claimed in claim 49, wherein said Si/SiGe-based optical absorption layer comprises an Si/SiGe multiple quantum well absorption layer.

51. The planar Si-based semiconductor photodetector as claimed in claim 49, wherein said first Si-based cladding layer comprises an impurity doped Si layer and a thickness of a recessed portion of said first Si-based cladding layer under said groove has a thickness of not more than 1.0 micrometers.

52. The planar Si-based semiconductor photodetector as claimed in claim 49, wherein said second Si-based cladding layer comprises an impurity doped Si layer which has a thickness of not more than 1.0 micrometers.

53. The planar Si-based semiconductor photodetector as claimed in claim 49, wherein said first Si cladding layer and said recessed portion of said second Si cladding layer have substantially the same thickness and substantially the same refractive index, and further said first and second Si-based insulation layers also have substantially the same thickness and substantially the same refractive index.

54. The planar Si-based semiconductor photodetector as claimed in claim 49, wherein said first Si-based insulation layer comprises a silicon oxide layer.

55. The planar Si-based semiconductor photodetector as claimed in claim 49, wherein said first Si-based insulation layer comprises a silicon nitride layer.

56. The planar Si-based semiconductor photodetector as claimed in claim 49, wherein said second Si-based insulation layer comprises a silicon oxide layer.

57. The planar Si-based semiconductor photodetector as claimed in claim 49, wherein said second Si-based insulation layer comprises a silicon nitride layer.

58. A mesa-structured Si-based semiconductor photodetector comprising:
    a substrate;
    a first Si-based insulation layer provided which extends over said substrate;
    a first Si-based cladding layer provided which extends over and contacts said first insulation layer, said first Si-based cladding layer having recessed portions and a mesa structured portion surrounded by said recessed portions;
    an Si/SiGe-based optical absorption layer provided on and contacting said mesa structured portion of said first Si-based cladding layer;
    a second Si-based cladding layer provided on and contacting said Si/SiGe-based optical absorption layer so that laminations of said first Si-based cladding layer, said Si/SiGe-based optical absorption layer and said second Si-based cladding layer are in the form of a mesa structure, and whereby said Si/SiGe-based optical absorption layer and said first and second Si-based cladding layers are in the form of a thin optical waveguide layer; and
    a second Si-based insulation layer extending over said recessed portions of said first Si-based cladding layer and over side walls and a top surface of said mesa structure, said second Si-based insulation layer having contact holes through which electrodes are made into contact with said second Si-based cladding layer,
    wherein each of said first and second Si-based insulation layers is lower in refractive index than any parts of said Si-based thin optical waveguide layer so that a light propagated through said Si-based thin optical waveguide layer reflects at said first and second interfaces without any permeation into said first and second Si-based insulation layers.

59. The mesa-structured Si-based semiconductor photodetector as claimed in claim 58, wherein said Si/SiGe-based optical absorption layer comprises an Si/SiGe multiple quantum well absorption layer.

60. The mesa-structured Si-based semiconductor photodetector as claimed in claim 58, wherein said first Si-based cladding layer comprises an impurity doped Si layer which has a thickness of not more than 1.0 micrometer.

61. The mesa-structured Si-based semiconductor photodetector as claimed in claim 58, wherein said second Si-based cladding layer comprises an impurity doped Si layer which has a thickness of not more than 1.0 micrometer.

62. The mesa-structured Si-based semiconductor photodetector as claimed in claim 58, wherein said first Si cladding layer and said recessed portion of said second Si cladding layer have substantially the same thickness and substantially the same refractive index, and further said first and second Si-based insulation layers also have substantially the same thickness and substantially the same refractive index.

63. The mesa-structured Si-based semiconductor photodetector as claimed in claim 58, wherein said first Si-based insulation layer comprises a silicon oxide layer.

64. The mesa-structured Si-based semiconductor photodetector as claimed in claim 58, wherein said first Si-based insulation layer comprises a silicon nitride layer.

65. The mesa-structured Si-based semiconductor photodetector as claimed in claim 58, wherein said second Si-based insulation layer comprises a silicon oxide layer.

66. The mesa-structured Si-based semiconductor photodetector as claimed in claim 58, wherein said second Si-based insulation layer comprises a silicon nitride layer.

67. A planar Si-based semiconductor photodetector comprising:
    a substrate;
    a first Si-based insulation layer provided which extends over said substrate;
    an Si-based cladding layer provided which extends over and directly contacts said first Si-based insulation layer, said Si-based cladding layer having a groove with a flat bottom;
    an Si/SiGe-based optical absorption layer buried within said groove so that a top surface of said Si/SiGe-based optical absorption layer has the same level as a top surface of said Si-based cladding layer, whereby laminations of said Si/SiGe-based optical absorption layer and said Si-based cladding layer are in the form of a thin optical waveguide layer; and
    a second Si-based insulation layer provided which extends over and directly contacts said top surface of said Si-based cladding layer and said top surface of said Si/SiGe-based optical absorption layer, said second Si-based insulation layer having contact holes through which electrodes are made into contact with said Si/SiGe-based optical absorption layer,
    wherein each of said first and second Si-based insulation layers is lower in refractive index than any parts of said Si-based thin optical waveguide layer so that a light propagated through said Si-based thin optical waveguide layer reflects at said first and second interfaces without any permeation into said first and second Si-based insulation layers.

68. The planar Si-based semiconductor photodetector as claimed in claim 67, wherein said Si/SiGe-based optical absorption layer comprises an Si/SiGe multiple quantum well absorption layer.

69. The planar Si-based semiconductor photodetector as claimed in claim 67, wherein said Si-based cladding layer comprises an impurity doped Si layer and a thickness of a recessed portion of said Si-based cladding layer under said groove has a thickness of not more than 1.0 micrometer.

70. The planar Si-based semiconductor photodetector as claimed in claim 67, wherein said first Si-based insulation layer comprises a silicon oxide layer.

71. The planar Si-based semiconductor photodetector as claimed in claim 67, wherein said first Si-based insulation layer comprises a silicon nitride layer.

72. The planar Si-based semiconductor photodetector as claimed in claim 67, wherein said second Si-based insulation layer comprises a silicon oxide layer.

73. The planar Si-based semiconductor photodetector as claimed in claim 67, wherein said second Si-based insulation layer comprises a silicon nitride layer.

74. A mesa-structured Si-based semiconductor photodetector comprising:

a substrate;

a first Si-based insulation layer provided which extends over said substrate;

an Si-based cladding layer extending over said first Si-based insulation layer, said Si-based cladding layer having recessed portions and a mesa structured portion surrounded by said recessed portions;

an Si/SiGe-based optical absorption layer provided on and contacting said mesa structured portion of said Si-based cladding layer so that laminations of said Si-based cladding layer and said Si/SiGe-based optical absorption layer are in the form of a mesa structure, and whereby said Si/SiGe-based optical absorption layer and said Si-based cladding layer are in the form of a thin optical waveguide layer; and a second Si-based insulation layer provided which extends over said recessed portions of said Si-based cladding layer and over side walls and a top surface of said mesa structure, said second Si-based insulation layer having contact holes through which electrodes are made into contact with said second Si-based cladding layer, wherein each of said first and second Si-based insulation layers is lower in refractive index than any parts of said Si-based thin optical waveguide layer so that a light propagated through said Si-based thin optical waveguide layer reflects at said first and second interfaces without any permeation into said first and second Si-based insulation layers.

75. The mesa-structured Si-based semiconductor photodetector as claimed in claim 74, wherein said Si/SiGe-based optical absorption layer comprises an Si/SiGe multiple quantum well absorption layer.

76. The mesa-structured Si-based semiconductor photodetector as claimed in claim 74, wherein said first Si-based cladding layer comprises an impurity doped Si layer which has a thickness of not more than 1.0 micrometer.

77. The mesa-structured Si-based semiconductor photodetector as claimed in claim 74, wherein said second Si-based cladding layer comprises an impurity doped Si layer which has a thickness of not more than 1.0 micrometer.

78. The mesa-structured Si-based semiconductor photodetector as claimed in claim 74, wherein said first Si-based insulation layer comprises a silicon oxide layer.

79. The mesa-structured Si-based semiconductor photodetector as claimed in claim 74, wherein said first Si-based insulation layer comprises a silicon nitride layer.

80. The mesa-structured Si-based semiconductor photodetector as claimed in claim 74, wherein said second Si-based insulation layer comprises a silicon oxide layer.

81. The mesa-structured Si-based semiconductor photodetector as claimed in claim 74, wherein said second Si-based insulation layer comprises a silicon nitride layer.

* * * * *